United States Patent [19]
Yamazaki et al.

[11] Patent Number: 5,726,947
[45] Date of Patent: Mar. 10, 1998

[54] SYNCHRONOUS SEMICONDUCTOR MEMORY DEVICE SUITABLE FOR GRAPHIC DATA PROCESSING

[75] Inventors: Akira Yamazaki; Katsumi Dosaka, both of Hyogo, Japan

[73] Assignee: Mitsubishi Denki Kabushiki Kaisha, Tokyo, Japan

[21] Appl. No.: 637,909

[22] Filed: Apr. 25, 1996

[30] Foreign Application Priority Data

Jul. 14, 1995 [JP] Japan ..................... 7-178628

[51] Int. Cl.[6] .................................... G11C 13/00
[52] U.S. Cl. ................. 365/230.03; 365/230.01; 365/200
[58] Field of Search .............. 365/230.01, 200, 365/230.03, 230.06

[56] References Cited

U.S. PATENT DOCUMENTS 4,472,792  9/1984  Shimohigashi et al. ........... 365/189.01

*Primary Examiner*—Terrell W. Fears
*Attorney, Agent, or Firm*—Lowe, Price, LeBlanc & Becker

[57] ABSTRACT

A semiconductor memory device includes a DRAM array and an SRAM array, a write data transfer buffer for storing data from the SRAM array to the DRAM array, and a read data transfer buffer for storing data from the SRAM array to the DRAM array. These DTBR and DTBW can be accessed via an input/output buffer. The semiconductor memory device further includes a graphic data readout buffer storing only graphic data. This graphic data readout buffer provides the stored data outside the memory device via the input/output buffer, and also receives and stores graphic data from the DRAM array via the DTBR. A cache for graphic data of an optimum size can be implanted. A multimedia application specific memory device can be provided which implements an efficient graphic data cache and a high hit rate CPU cache.

18 Claims, 24 Drawing Sheets

SYNCHRONOUS SEMICONDUCTOR MEMORY DEVICE SUITABLE FOR GRAPHIC DATA PROCESSING

BACKGROUND OF THE INVENTION

1. Field of the Invention

The present invention relates to semiconductor memory devices, and more particularly, to a semiconductor memory device having a memory of large capacity and a memory of high speed both integrated on the same semiconductor substrate. Particularly, the present invention relates to a structure of a semiconductor memory device suitable for graphic data processing applications.

2. Description of the Background Art

A multimedia system is recently developed progressively that processes different media information such as character information, audio information, and moving picture information on the same platform. Such a system requires high speed processing of a great amount of graphic data generally used in moving pictures. The multimedia system generally employs a structure as set forth in the following.

FIG. 22 schematically shows a structure of a conventional image processing system. Referring to FIG. 22, the image processing system includes a central processing unit (CPU) 1 that carries out required operational processings on data, and a graphic engine 2 for processing graphic data and displaying graphic data on an image display unit. Graphic engine 2 differs from CPU 1 in that it carries out only graphic data processing. In contrast, CPU 1 processes graphic data, executes commands and instructions, and controls the operation of the overall system.

The image processing system further includes a static random access memory (SRAM) 3 used as a cache memory for CPU 1 and graphic engine 2, a dynamic random access memory (DRAM) 4 used as the main memory of the system, and a video memory (VRAM) 5 coupled to graphic engine 2 and used as a buffer memory for graphic data. CPU 1, graphic engine 2, SRAM 3, and DRAM 4 are connected to each other via a common data bus 6.

CPU 1 normally accesses SRAM 3, and accesses DRAM 4 only when data of a memory cell at a required address is not present in SRAM 3. Graphic engine 2 accesses DRAM 4 to store the required data in video memory 5, and writes data again into video memory 5 after required processing is carried out. Display on an image display unit (not shown) is effected by sequentially providing data stored in video memory 5 to the image display unit.

In the above-described processing system, a plurality of types of memories are used according to the processing applications. Therefore, a greater number of memories is employed to increase the system cost and degrade the mounting density on a board. There is a problem that a processing system of small size and low cost could not be built.

Furthermore, with development in micronization of the processing technique, the integration density of a DRAM is increasing at a rate of 4 times per 3 years. It is expected that a main memory can be formed of 1 chip in a near future. For example, as for a 64M-bit DRAM, a storage capacity of 8M words·8 bits can be realized using a memory of one chip. However, the requirement of using a plurality of types of memories will become a bottleneck in sufficiently reducing the cost and increasing the mounting density even if the cost and occupying area of a main memory can be reduced due to the implementation of a main memory with one chip. This problem has already been encountered in systems such as a personal computer that employ a main memory of a relatively small capacity.

FIG. 23 schematically shows a conventional improved processing system. The system of FIG. 23 has CPU 1 and graphic engine 2 connected to a high speed of DRAM 7 via a common data bus 6. High speed of DRAM 7 stores program data used by CPU 1 and graphic data used by graphic engine 2.

FIG. 24 is a timing chart representing an operation of the data processing system shown in FIG. 23. It is appreciated from FIG. 24 that CPU 1 and graphic engine 2 alternately access high speed DRAM 7 every cycle of a main clock which is, for example, a system clock. More specifically, CPU 1 and graphic engine 2 access high speed DRAM 7 in a time-division multiplexed manner via an interface circuit not shown. By using the structure shown in FIG. 23, functions of three different types of memories (SRAM 3, DRAM 4, and VRAM 5 in FIG. 22) can be realized employing high speed DRAM 7 of one chip. Accordingly, the mounting density of a system can be increased and the cost thereof is reduced.

As a high speed DRAM that is suitable for realizing the above-described function, a cache DRAM (CDRAM) is well-known having a DRAM of a large storage capacity and an SRAM of high speed integrated on the same chip. A cache DRAM can implement random access at high speed due to the integration of a high speed SRAM. Even in a structure in which program data required by CPU 1 and graphic data required for graphic engine 2 are accessed time-divisionally, required data can be accessed speedily by increasing the main clock frequency. Therefore, there is almost no degradation in the system performance.

FIG. 25 schematically shows an entire structure of a conventional CDRAM. Referring to FIG. 25, the conventional CDRAM includes a DRAM array 10 having a memory capacity of 4M·4 bits, an SRAM array 12 having a memory capacity of 4K·4 bits, a readout data transfer buffer (DTBR) 14 for transferring simultaneously data of 16·4 bits from DRAM array 10 to SRAM array 12, and a write data transfer buffer (DTBW) 16 for transferring data of 16·4 bits in parallel from SRAM array 12 to DRAM array 10.

DTBR 14 includes a master latch 20 for storing data of 16·4 bits provided from DRAM array 10 via a DRAM data bus 30, and a slave latch 22 for transmitting data stored in master latch 20 to an SRAM data bus 32. DTBW 16 includes a master latch 24 for storing data from SRAM data bus 32, and a slave latch 26 for receiving and transmitting to a DRAM data bus 30 the data stored in master latch 24. SRAM data bus 32 is connected to an input/output data bus 34 of 4 bits in width via a decoder circuit not shown. Input/output data bus 34 is connected to an input/output buffer 28.

As will be described in detail afterwards, input/output buffer 28 transmits and receives data to and from DTBW 14, DTBR 16, and SRAM array 12.

DRAM array 10 and SRAM array 12 may be addressed independently of each other. Data of a memory cell at any position in DRAM array 10 is transmitted onto DRAM data bus 30. Therefore, data of any position in DRAM array 10 can be transferred to SRAM array 12. Data to be transferred can be provided at a time using DTBR 14 and DTBW 16 having a capacity of 16·4 bits, to allow high speed data transfer. When SRAM array 12 is used as a cache memory, data of a cache block can be transferred from DRAM array 10 to SRAM array 12 at a time upon a cache miss. Therefore, the wait time of an external processor can be reduced.

FIG. 26 is a block diagram showing a structure of a portion of the DTBR and DTBW of 1 bit shown in FIG. 25. Referring to FIG. 26, a DTBR 14 includes a preamplifier 43 responsive to a preamplifier enable signal DPAE to amplify data on global IO lines GI/O and ZGI/O forming a DRAM data bus of one bit, a master latch circuit 20a for latching data amplified by preamplifier 43, and a transfer gate 44 responsive to a transfer designating signal DRTE for transferring data latched in master latch circuit 20a to a slave latch circuit 22a.

DTBR 16 includes a mater latch circuit 24a for latching transferred data, a transfer gate 41 responsive to a transfer designating signal DWTE for transferring data latched in master latch circuit 24a to a slave latch circuit 26a, and a preamplifier 42 responsive to a preamplifier enable signal DWDE for amplifying and transmitting to global I/O lines GI/O and ZGI/O data latched in slave latch circuit 26a. Global I/O line GI/O and ZGI/O transfer data signals complementary to each other, and form a 1-bit DRAM data bus 30a.

Input/output buffer 28 includes an input buffer 61 responsive to a write designating signal W for amplifying data DQ of 1 bit applied to a data input/output terminal and generating internal write data, and a main amplifier 62 activated in response to a readout designating signal R for amplifying applied data and generating readout data.

In order to selectively connect DTBR 14 and DTBW 16 and SRAM array 12 with input/output buffer 28, there are provided a write driver 51 activated in response to a write decode signal SYW for amplifying data provided from an input buffer 61 and transmitting the amplified data to SRAM bit lines SBL and ZSBL, a decoder 52 responsive to a write decode signal BYW for transmitting data provided from input buffer 61 to master latch circuit 24a, a driver 53 activated in response to a transfer designating signal BWTE for amplifying data on SRAM bit lines SBL and ZSBL for transmitting the amplified data to master latch circuit 24a, a driver 54 activated in response to a transfer designating signal BRTE for transmitting data latched in slave latch circuit 22a to SRAM bit lines SBL and ZSBL, a selector 55 responsive to an access select signal SEL for selecting data among those from driver 54, slave latch circuit 22a, and SRAM bit lines SBL and ZSBL, and a decoder 56 activated in response to read decode signal RYW for amplifying a signal selected by selector 55 and transmitting the amplified signal to main amplifier 52. Drivers 53 and 54 are shown being included in each of DTBW 16a and DTBR 14a.

SRAM bit lines SBL and ZSBL are signal lines for transferring complementary SRAM data, and form a 1-bit SRAM data bus 32a. Decode signals BYW, SYW, and RYW select data of 1 bit out of the 16-bit data. Input/output buffer 28a inputs and outputs data of 1 bit. Four input/output buffers 28a are provided for data input/output of 4 bits. Data can be written from input buffer 51 to SRAM data bus 32a by write driver 51. Data can be written into DTBW 16 from input buffer 51 by decoder 52. Data can be transferred between SRAM data bus 32a and DRAM data bus 30a by driver 53. Data can be transferred between DRAM data bus 30a and SRAM data bus 32a by driver 54. Selector 55 selects either one of data of SRAM data bus 32a and DTBR 16 and provides the selected data to input/output buffer 28.

By forming data transfer buffers DTBR and DTBW by a master latch and a slave latch, data can be transferred from the DRAM array to the SRAM array in parallel to data transfer from the SRAM array to the DRAM array. Therefore, copy back can be carried out at high speed in a cache miss state when the SRAM is used as a cache memory. Since CDRAM has a high speed DRAM integrated therein, required data can be obtained at a desired speed with almost no degradation in the system performance. This is because high speed access is allowed even when program data (CPU data) and graphic data are accessed in a time-divisional manner.

In caching graphic data in a CDRAM, there are two possible approaches. One is to use an SRAM array, and the other to use a data transfer buffer. When an SRAM array is used as a cache region for graphic data, graphic data of a graphic data storage region 60 in DRAM array 10 is stored in a SRAM array 12, as shown in FIG. 27. SRAM array 12 has a storage capacity of 4K·4 bits. Therefore, when one scanning line of an image picture is formed of 1024 pixels, and one pixel is formed of 8-bit data, graphic data of one scanning line can be stored in SRAM array 12. In general, graphic data processing is carried out in units of pixels of 16 rows×16 columns or 8 rows×8 columns in moving picture processing (for example, discrete cosine transform processing). Therefore, sufficient performance can be provided as long as a region storing data of 16 pixels is used as the cache of graphic data. When the region of SRAM array 12 shown in FIG. 27 is used as a cache region of graphic data, there is a problem that the usage efficiency of a SRAM array is degraded since a larger region of SRAM array 12 than needed will be used as the graphic data cache region. This is because graphic data of only a part of the region of one scanning line is often used in graphic data processing.

Problems encountered when DTBR 14 and DTBW 16 are used as a cache region are set forth in the following.

Referring to FIG. 28, program data used by a CPU is stored in SRAM array 12, and graphic data is stored in a DTB 15 (including both DTBR 14 and DTBW 16). Data transfer between DRAM array 10 and SRAM array 12 is carried out via DTB 15. When required data is to be transferred from DRAM array 10 to SRAM 12 in a cache miss state of program data, care must be taken so that graphic data stored in DTB 15 is not rewritten by the program data. In this case, two approaches can be considered: (i) to inhibit an access by the CPU (wait state) until the graphic data stored in data transfer buffer DTB 15 are all processed by the graphic engine; and (ii) to transfer program data required by the CPU from DRAM array 10 to SRAM array 12, and then transfer graphic data again from the graphic data storage region of DRAM array 10 to DTB 15. However, the methods of (i) and (ii) both accompany the problem that the time period of the wait state of CPU, or the graphic engine becomes longer. Thus, high speed data processing cannot be realized, and the system performance is degraded.

SUMMARY OF THE INVENTION

An object of the present invention is to provide a semiconductor memory device that can effectively cache data used in particular processing, such as graphic data.

Another object of the present invention is to provide a semiconductor memory device suitable for multimedia system application and accompanying no degradation in the system performance.

A further object of the present invention is to provide a high speed semiconductor memory device of a small occupying area in that can store efficiently different multimedia data.

A semiconductor memory device according to the present invention includes a DRAM array, an SRAM array, and a data transfer buffer having a latching function and a function of data transfer between the SRAM array and the DRAM array. The semiconductor memory device further includes a buffer memory that stores data used in a particular process.

In other words, the semiconductor memory device of the present invention includes a first memory array having a plurality of memory cells, a second memory array provided independently of the first memory array and including a plurality of memory cells, and a data transfer circuit provided between the first and second memory arrays for transferring data therebetween. The data transfer circuit includes a component for storing transfer data.

The semiconductor memory device according to the present invention further includes a storage circuit transmitting and receiving data to and from a first memory array, and storing data used in a particular process, and an input/output circuit selectively connected to the data transfer circuit, the second memory array, and the storage circuit for data input/output with the outside world.

The circuit for storing data, such as graphic data, used in a particular process allows data transfer with the first memory array, and is coupled to the input/output circuit. Therefore, an external device that carries out the particular process is allowed of high speed access by accessing the storage circuit. By setting the storage capacity of the storage circuit to an appropriate value, data used in the particular process can be cached efficiently.

Furthermore, an external processor such as a CPU can access required data speedily with no influence of data stored in the storage circuit by accessing the data transfer buffer or the second memory array. Therefore, the data transfer buffer and the second memory array can be used as a cache memory for the external processor such as CPU. A cache memory having an appropriate storage capacity can be implemented with respect to an external processor such as a CPU. Thus, a semiconductor memory device most appropriate for a multimedia system application can be realized.

The foregoing and other objects, features, aspects and advantages of the present invention will become more apparent from the following detailed description of the present invention when taken in conjunction with the accompanying drawings.

DESCRIPTION OF PREFERRED EMBODIMENTS

First Embodiment

Figure 1:
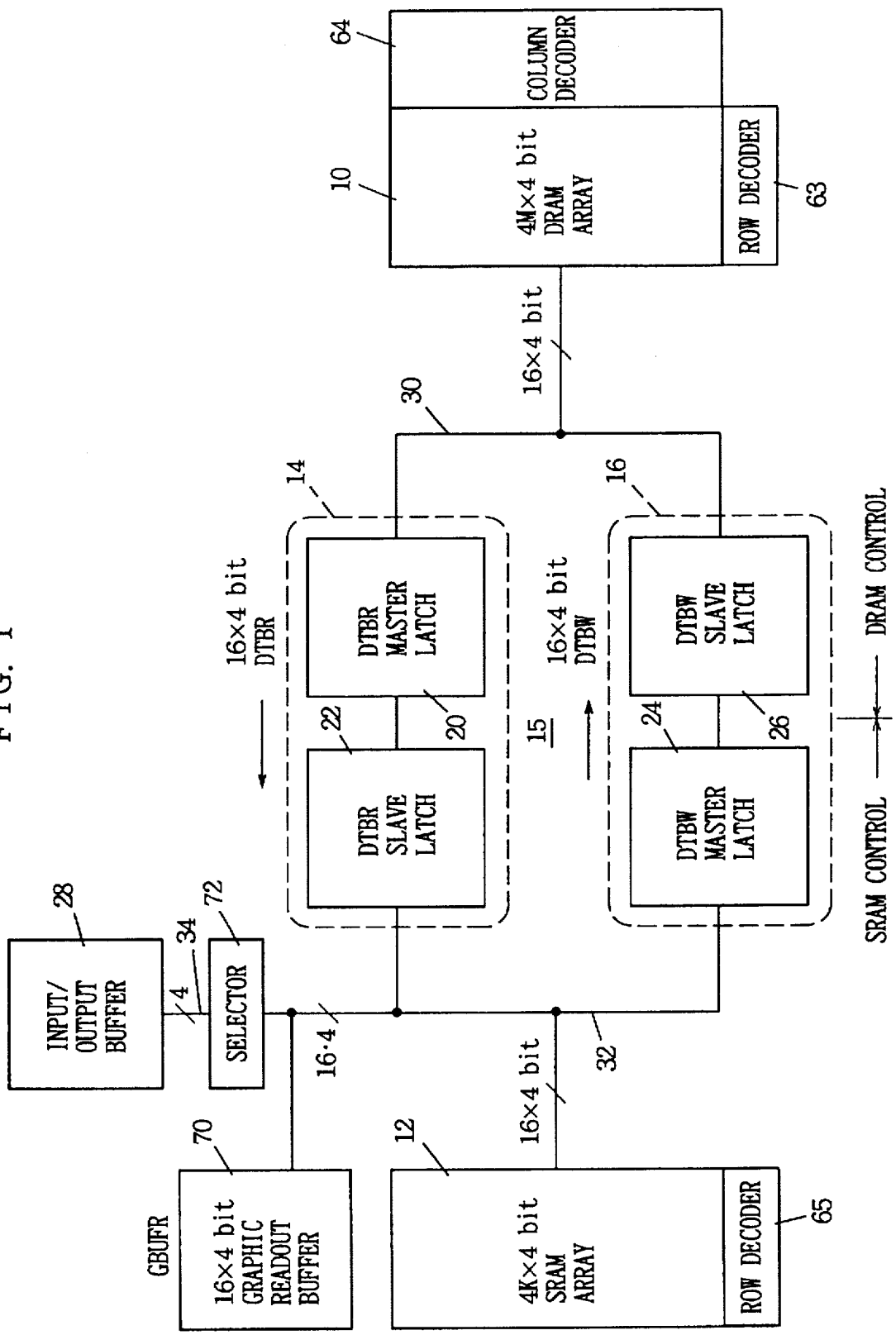
FIG. 1 is a block diagram schematically showing a structure of a main part of a semiconductor memory device according to a first embodiment of the present invention.

Referring to FIG. 1, a semiconductor memory device according to a first embodiment of the present invention includes a DRAM array 10 as a first memory array, an SRAM array 12 as a second memory array, and a data transfer buffer 15 as data transfer means connected to a DRAM data bus 30 and an SRAM data bus 32. Data transfer buffer 15 includes a read data transfer buffer DTBR 14 and a write data transfer buffer DTBW 16, similarly to a conventional data transfer buffer.

DRAM array 10 has a memory capacity of, for example, 4M bits·4 bits, and has memory cells of 16·4 bits selected simultaneously by a row decoder 63 and a column decoder 64. SRAM array 12 has a memory capacity of, for example, 4K bits·4 bits, and has four word lines selected simultaneously by row decoder 65. Memory cells of 16 bits are connected to each word line. SRAM array 12 has data of 16 bits×4 bits selected simultaneously.

DTBR 14 includes a master latch 20 for latching data transmitted from DRAM array 10 to DRAM data bus 30, and a slave latch 22 for latching data stored in master latch 20, similarly to a conventional DTBR. DTBW 16 includes a master latch 24 for storing data transmitted on SRAM data bus 32 from SRAM array 12 or from input/output buffer 28, and a slave latch 26 for latching data stored in master latch 24.

A graphic readout buffer 70 for storing graphic data used for image processing which is a particular process is connected to SRAM data bus 32. Graphic readout buffer (GBUFR) 70 has a storage capacity of 16 bits·4 bits, similar to that of data transfer buffer 15. SRAM data bus 32 is connected to data input/output bus 34 of 4 bits in width via a selector 72 responsive to an output of a decoder not shown. Data input/output bus 34 is connected to an input/output buffer 28 as an input/output circuit. 4-bit data is input/output via input/output buffer 28.

Graphic readout buffer 70 receives and stores data used for a particular process from DRAM array to via DTBR 14, which data is referred to simply as "graphic data" hereinafter. Graphic readout buffer 70 sequentially provides stored data via input/output buffer 28 under the control of control circuitry that will be described in detail afterwards.

Figure 2:
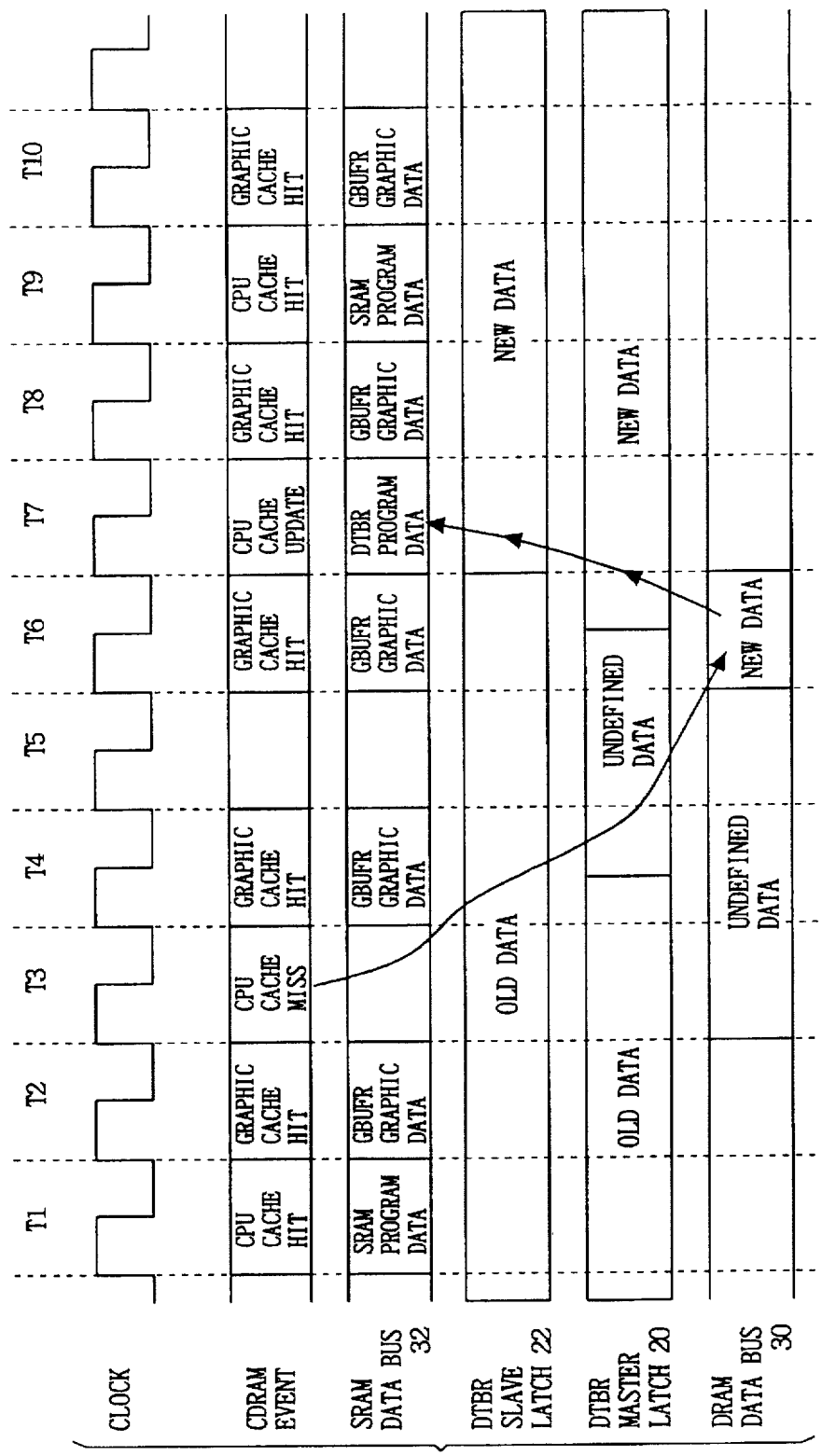
FIG. 2 is a timing chart representing an operation of the semiconductor memory device of FIG. 1.

An address signal is supplied to row decoder 63 and column decoder 64 in the DRAM, and to row decoder 65 in SRAM array 12 via separate paths (pin terminals). A column decoder that will be described afterwards uses an SRAM address or a DRAM address to select and couple data of 4 bits on SRAM data bus 32 of 16·4 bits to input/output data bus 34. As will be described in detail afterwards, a selector 72 has the function of coupling any of data transfer buffer 15, SRAM array 12, and graphic readout buffer 70 to data input/output bus 30. An operation of the semiconductor memory device of FIG. 1 will now be described with reference to the timing chart of FIG. 2.

Graphic readout buffer (GBUFR) 70 stores graphic data transferred from DRAM array 10 via readout data transfer buffer DTBR 14. Furthermore, it is assumed that SRAM array 12 stores program data transferred from DRAM array 10 that are used by a CPU.

This semiconductor memory device (CDRAM) incorporates an external signal in synchronization with an external clock signal which is a system clock, for example, and inputs/outputs valid data in synchronization with this external clock signal. However, a clock synchronous type semiconductor memory device is not particularly required, and any semiconductor memory device that operates within a cycle of a system clock can be used. A CPU and a graphic engine which are external processors access the CDRAM in synchronization with the external clock.

The frequency of this clock does not have to be identical to that of the clock signal defining the operation rate of the CPU and the graphic engine. A clock signal higher in speed than the clock signal that defines the operating rate of the CPU and graphic engine is generally used to define the cycle of accessing the CDRAM. The CPU accesses the CDRAM at a cycle T1 of a clock signal. When the data required by the CPU is present in SRAM array 12, it is a CPU cache hit, and access to a corresponding memory cell in SRAM array 12 is effected. In reading out data, data of corresponding memory cells in SRAM array 12 are read out to SRAM data bus 32, and are further selected by selector 72 and read out via input/output buffer 28.

In the next cycle T2, graphic engine 2 accesses the CDRAM. In this case, graphic data required by graphic engine 2 is stored in graphic readout buffer 70. Therefore, a graphic cache hit holds. In this case, data stored in graphic readout buffer (referred to as GBUFR hereinafter) 70 is read out to data input/output bus 34 via selector 72, and then output via input/output buffer 28.

At cycle T3, where data required by the CPU is not present in SRAM array 12, a CPU cache miss holds. In this case, the data of a block (cache block) including the data required by the CPU must be transferred from DRAM array 10 to SRAM array 12. At cycle T3, memory cells in the corresponding block in DRAM array 10 are selected, and data in the selected memory cells are transferred.

At cycle T6, data of a corresponding memory cells are transmitted to DRAM data bus 30. The latency is 3 cycles, and data appearing on DRAM data bus 30 at cycle T6 is transferred to master latch 20 of DTBR 14. The data of DTBR master latch 20 attaining an undefined state at cycle T5 is rewritten by new data, and data in DTBR slave latch 22 is rewritten by new data (the data required by the CPU) in cycle T7.

At cycle T7, the data required by the CPU is transferred from SRAM data bus 32 to input/output buffer 28 via selector 72 to be read out in parallel to data transfer from DTBR slave latch 22 to SRAM array 12. Update of the CPU cache in SRAM array 12 is carried at cycle T7.

CPU attains a wait state in a CPU cache miss condition during cycles T3 and T6. Graphic engine 2 accesses the CDRAM at cycles T4 and T6 respectively to read out the required data from GBUFR 70.

At the following cycles T8, T9, and T10, the CPU and the graphic engine access the CDRAM, respectively, to access data in required memory cells. At a cache miss state of the graphic engine, an operation similar to that of the above-described CPU cache miss state is carried out. More specifically, required data is transferred from DRAM array 10 to GBUFR 70 via DTBR 14. When graphic data is processed with pixels of 16 rows and 16 columns as a unit, the readout time point of graphic data of one row can be identified in advance. Therefore, by selecting the next row of data and transmitting the selected data to slave latch 22 of DTBR 14 via master latch 20 in advance, pixel data can be transferred from SRAM data bus 32 to input/output buffer 28 via selector 72 in parallel to data transfer from slave latch 22 of DTBR 14 to GBUFR 70 at the time of access of the next row of pixel data.

The SRAM portion and the DRAM portion can be driven (activation/precharge) independently of each other in the CDRAM (the structure thereof will be described afterwards). Therefore, by selecting the next row of pixel data in DRAM array 10 and transferring the same to DTBR 14 in parallel to reading out data from GBUFR 70 as described above, pixel data required by the graphic engine can be continuously supplied thereto. In other words, a graphic data cache memory of a high hit rate can be built using GBUFR 70 of one block size (16·4 bits).

Even in the case where graphic data are not processed in units of 16 rows·16 columns, and the graphic engine transfers data to an image display device according to a raster scanning sequence, the required graphic data can be read out and transferred to the image display device with no graphic engine cache miss, by transferring pixel data of one scanning line sequentially from DRAM array 10 to DTBR 14 in units of blocks. The graphic engine enters a wait state when a CPU cache miss occurs, and the program data for the CPU must be transferred between the DRAM array and the SRAM array (in the case where the priority of the CPU program data is higher than that of the graphic data for the graphic engine).

Figure 3:
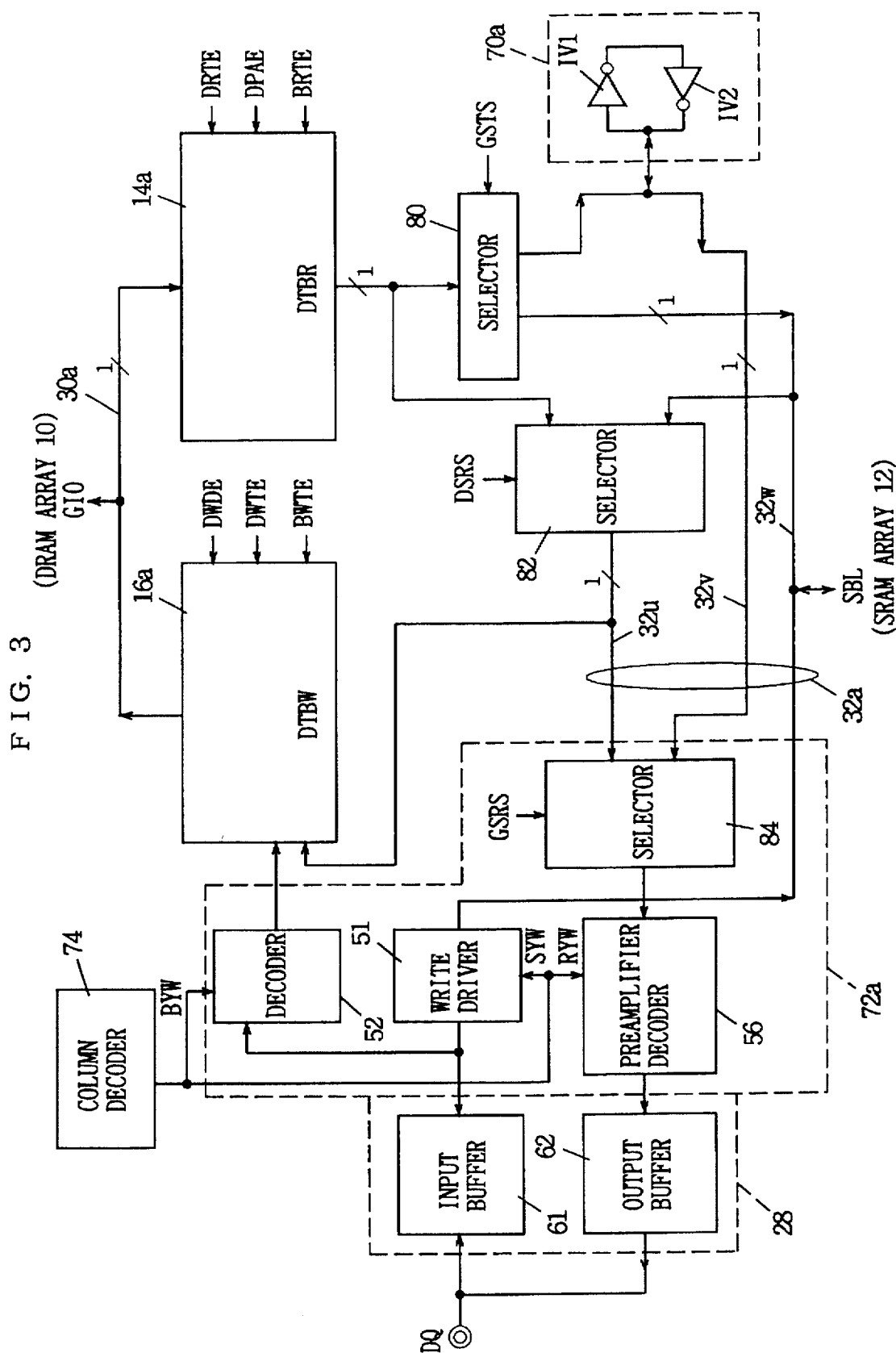
FIG. 3 shows a structure of the components related to input/output and transfer of 1-bit data of the semiconductor memory device of FIG. 1.
Figure 26:
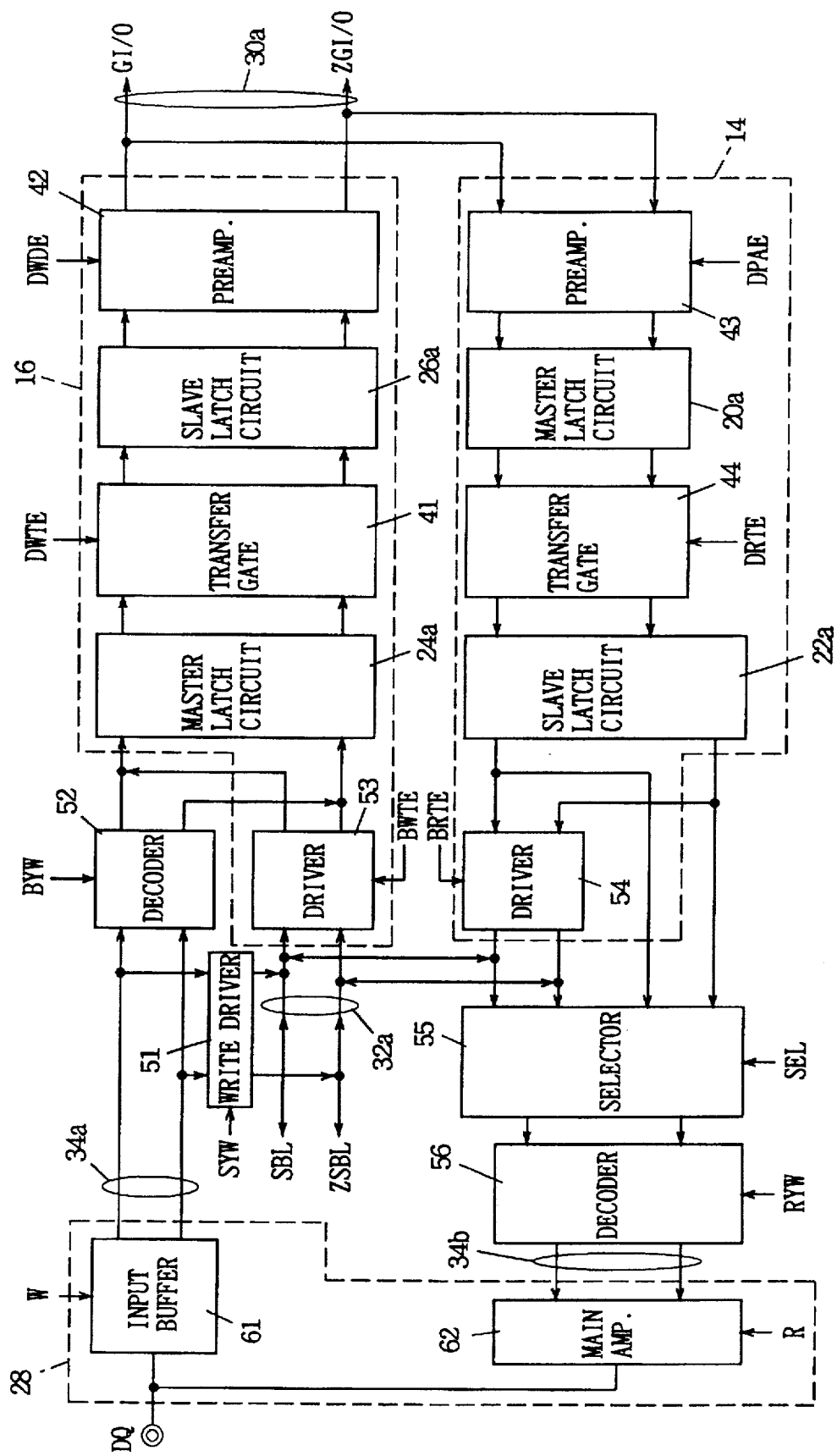
FIG. 26 shows a structure of a portion related to input/output of 1-bit data of the semiconductor memory device of FIG. 25.
Figure 27:
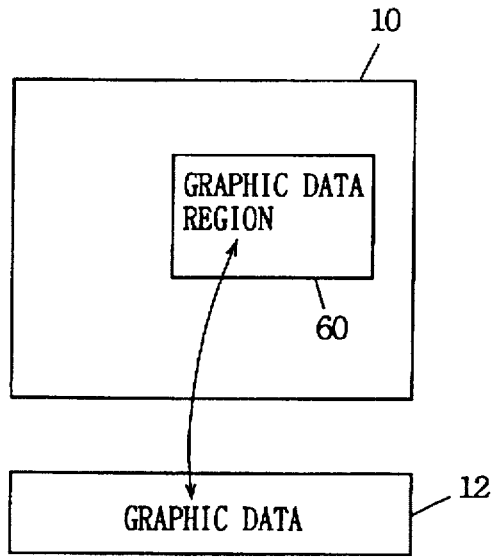
FIG. 27 is a diagram used for describing an example of a cache method of graphic data of a conventional semiconductor memory device.
Figure 28:
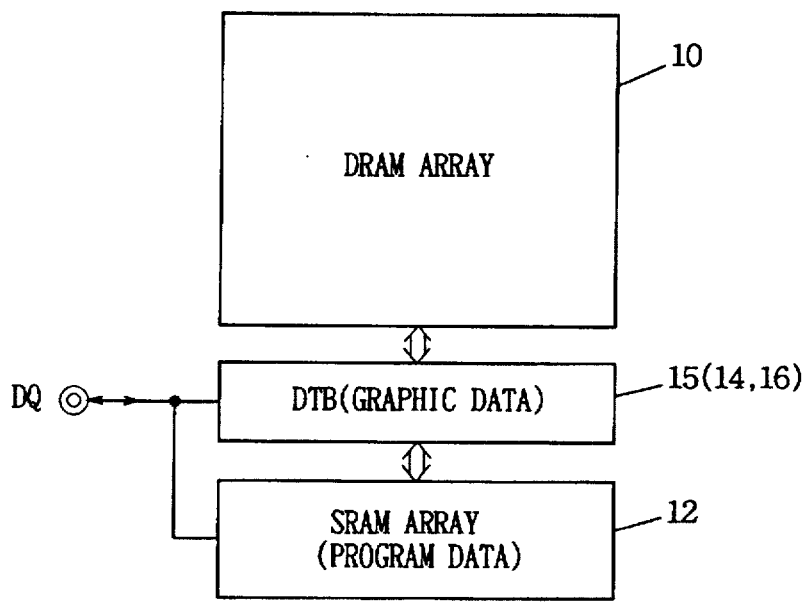
FIG. 28 is a diagram used for describing another cache method of graphic data of a conventional semiconductor memory device.

FIG. 3 shows a structure of the data input/output portion and the GBUFR of the semiconductor memory device of the first embodiment. Referring to FIG. 3, a DTBR 14a and a DTBW 16a respectively of one bit are represented as one block. The specific structure of DTBR 14a and DTBW 16a is identical to that shown in FIG. 26. DTBR 14a receives a preamplifier enable signal DPAE, a data transfer designating signal DRTE for instructing data transfer from a master latch circuit to a slave latch, and a data transfer designating signal BRTE for instructing data transfer from a slave latch. DTBW 16a responds to data transfer designating signal DWTE instructing data transfer from SRAM array 12 to a master latch, a data transfer designating signal DWTE for instructing data transfer from a master latch to a slave latch, and a preamplifier enable signal DWTE for transferring data latched in a slave latch to DRAM array 10.

A DRAM data bus 30a of one bit is connected to a global IO line GIO to which memory cell data is transferred in DRAM array 10.

A GBUFR 70a of 1 bit in GBUFR 70 includes an inverter latch formed of inverters IV1 and IV2, for example. The driving capability of inverter IV1 is set greater than that of inverter IV2. A selector 80 responsive to a select signal GSTS is provided in order to selectively transmit data from DTBR 14a to one of SRAM array 12 and GBUFR 70. This select signal GSTS also functions as a signal designating data transfer, and sets selector 80 to an output high impedance state when data transfer is not carried out. This is to prevent unrequired data from being transferred to inverter latch (IV1 and IV2) of GBUFR 70a. The structure of FIG. 3 is illustrated only schematically, and a transfer gate rendered conductive in response to a data transfer designating signal may be provided between GBUFR 70a and selector 80.

A selector 82 responsive to a select signal DSRS is provided for selecting either data transferred from DTBR 14a or data from SRAM array 12 (the data on the SRAM bit line pair). An output signal of selector 82 is applied to an SRAM data bus line 32u. The data on data bus line 32u is provided to DTBW 16a. DTBW 16a stores data received from data bus line 32u in a slave latch circuit therein upon activation of signal BWTE. The data stored in GBUFR 70a is transferred onto a SRAM data bus line 32v.

Selector 72 shown in FIG. 1 (selector 72a of 1 bit) includes a decoder 52 activated in response to a memory cell select signal (a signal specifying one of 16 bits) BYW generated in data writing from column decoder 74 for transmitting write data from input buffer 61 in input/output buffer 28 to DTBW 16a, a write driver 51 activated in response to a write select signal SYW from column decoder 74 for transmitting write data from input buffer 61 onto an SRAM data bus line 32w, a selector 84 for selecting data transmitted on SRAM data bus line 32u from selector 82 or data appearing on SRAM data bit line 32v according to select signal GSRS, and a preamplifier decoder 56 responsive to a select signal RYW from column decoder 74 at a readout operation to be activated for amplifying an output signal of selector 84.

Select signal RYW from column decoder 74 selects one bit out of the 16 bits. The structure of selector 72a, GBUFR 70a, DTBR 14a and DTBW 16a shown in FIG. 3 is provided 16 bits·4 in number. SRAM data bus lines 32u, 32v and 32w form SRAM data bus 32 (one bit bus 32a). An output signal of preamplifier decoder 56 is applied to output buffer 62. In transferring data from DRAM array 10 to SRAM array 12, DTBR 14 is activated, and selector 80 transfers data from this DTBR 14a to SRAM data bus line 32w. In transferring data from DRAM array 10 to GBUFR 70, selector 80 transfers data from DTBR 14 to GBUFR 70a according to select signal GSTS. In transferring data from SRAM array 12 to DRAM array 10, selector 82 selects the data of SRAM array 12 and transmits the selected data to DTBW 16. According to the above-described structure, access to SRAM array 12, access to GBRFR 70, access to DTBR 14, data transfer between DRAM array 10 and SRAM array 12, and data transfer between DRAM array 10 and GBUFR 70 can be implemented.

Figure 4:
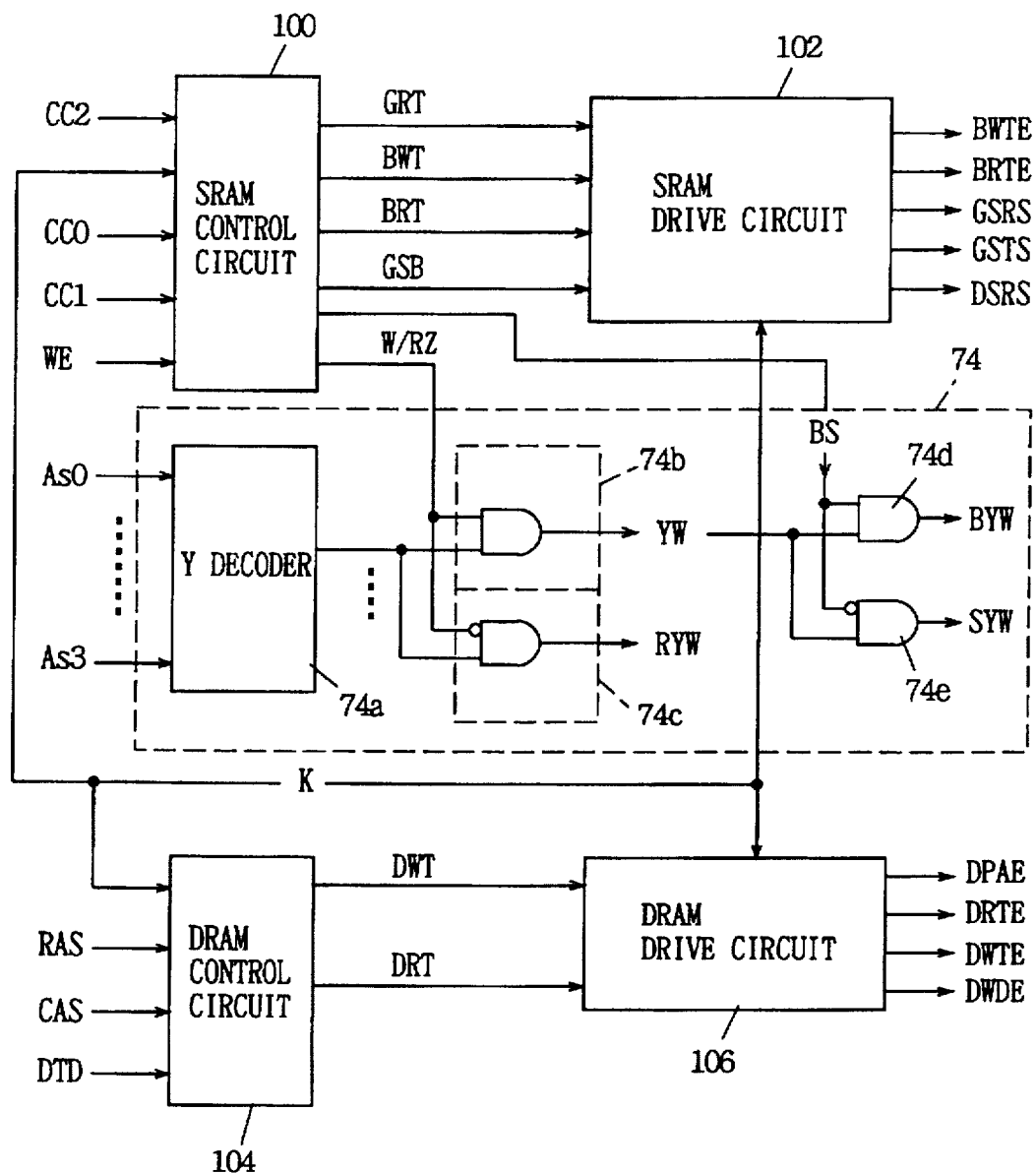
FIG. 4 shows a structure of the portion generating a control signal shown in FIG. 3.

FIG. 4 shows a structure of the control portion that generates a select signal and a transfer control signal shown in FIG. 3. Only the portion related to data transfer is shown in FIG. 4. A control signal is provided to row decoder 63 and column decoder 64 in the DRAM array portion and to row decoder 65 of SRAM array 12 shown in FIG. 1 from this portion of FIG. 4, and a decoding operation is carried out.

The SRAM portion and the DRAM portion of the present CDRAM has their operation controlled by separate control circuits as shown in FIG. 4. The SRAM portion includes a SRAM control circuit 100 responsive to external control signals CC0–CC2, and a data write/read designating signal WE for providing internal control signals GRT, BWT, BRTW/RZ, GSB and BS, and a SRAM drive circuit 102 responsive to control signals GRT, BWT, GSB and BRT from SRAM control circuit 100 for providing data transfer signals BWTE, BRTE, and select signals GRS, GSTS, and DSRS. SRAM control circuit 100 operates in synchronization with a clock signal K to receive external control signals at a rising edge of clock signal K to identify a specified operation according to the states of the external control signals to output internal control signals. An object to be accessed is identified on the basis of the combination of control signals CC1–CC2. The direction of data transfer and also data input/output are determined according to signal WE. For example, a data transfer buffer (DTBR and DTBW) is selected when all control signals CC0–CC2 attain a low level (logical low). Identification of either DTBR 14 or DTBW 16 can be made by signal WE. When signal WE designates data writing, a data writing operation with respect to DTBW 16 is carried out. When signal WE designates data readout, data stored in DTBR 14 is selected.

When signals CC0 and CC2 attain a low level, and CC1 attains a high level (logical high), data transfer between the SRAM array and the data transfer buffer (DTBR, DTBW) is designated. The data transfer direction is determined by signal WE. When signal WE instructs data writing, a collective transfer of data of 16 bits·4 bits from the SRAM array to DTBW 16 is designated. When signal WE designates data readout, a collective data transfer of 16 bits·4 bits from DTBR 14 to SRAM array 12 is designated.

When signal CC0 attains a high level, and signals CC1 and CC2 attain a low level, access to SRAM array 12 is designated. When signal WE designates data writing, data is written into a corresponding memory cell in SRAM array 12. When signal WE designates data readout, data of an addressed memory cell is read out from SRAM array 12.

When signal CC2 attains a high level, and signals CC0 and CC1 attain a low level, and when signal WE designates data readout, readout of data from GBUFR 70 is instructed. When signals CC1 and CC2 attain a high level and signal CC0 attains a low level, and signal WE designates data readout, a collective data transfer of 16 bits·4 bits from DTBR 14 to GBUFR 70 is instructed.

According to the above-described combination of control signals, SRAM control circuit 100 outputs control signals GRT, BWT, and BRT for designating data transfer, and data transfer object select signals GSB and BS. Signal GRT designates data transfer from DTBR 14 to DBRFR 70. Signal BWT designates data transfer from SRAM array 12 to DTBW 16. Signal BRT designates data transfer from DTBR 14 to SRAM array 12. Signal BS selects either DTB or SRAM array. Signal GSB indicates which of GBUFR, DTB, or SRAM array is to be accessed.

SRAM drive circuit 102 outputs transfer designating signals BWTE and BRTE and select signals GSRS, GSTS and DSRS at appropriate timings according to transfer designating signals GRT, BWT, and BRT and object designating signal GSB. In transferring data from SRAM array 12 to DTBW 16 (DRAM array 10), transfer designating signal BWTE is activated, and select signal DSRS for selector 82 is set to a state for selecting data on SRAM data bus line 32w. When data is to be written into DTBW 16 from input buffer 61, transfer signal BWTE attains an inactive state. In this case, decoder 52 of FIG. 3 is activated according to select signal BYW from column decoder 74 that will be described afterwards to write data from input buffer 61 into DTBW 16.

When signal BRT attains an active state, SRAM drive circuit 102 sets select signal DSRS to a state of selecting an output signal of DTBR 14, and sets select signal GSRS to a state for selecting an output signal of selector 82. Here, transfer designating signal BRTE attains an active state. When signal GRT attains an active state, data transfer from DRAM array 10 towards GBUFR 70 is designated. In this case, signal GSTS is set to a state for transferring data of DTBR 14a to DBUFR 70a, and signal BRTE is activated.

In external access to GBUFR 70, DTBR 14, DTBR 16 and SRAM array 12 related to data transfer, transfer designating signals BWTE and BRTE are rendered inactive. Only select signals DSRS and GSRS are set to the specified states. A control signal in an access mode not associated with data transfer is representatively shown as a signal GSB provided from SRAM control circuit 100 to SRAM drive circuit 102.

The portion related to drive the DRAM includes a DRAM control circuit 104 receiving signals RAS, CAS and DTD at a rising edge of clock signal K for identifying an operation mode specified by the states of these signals, and providing transfer designating signals DWT and DRT according to the determination result, and a DRAM drive circuit 106 for providing signals DPAE, DRTE, DWTE and DWDE for driving a data transfer buffer according to data transfer designating signals DWT and DRT from DRAM control circuit 104. Examples of the combinations of these signals are set forth in the following.

When signal RAS attains a low level and signals CAS and DTD both attain a high level, a memory cell select operation is instructed in the DRAM array. When signals RAS and DTD both attain a low level and signal CAS attains a high level, a precharge operation of this DRAM array is instructed. When signal RAS attains a high level and signal CAS attains a low level, data transfer between a DRAM array and a data transfer buffer (DTBR, DTBW) is instructed. The direction of data transfer is specified by signal DTD. When data transfer from DRAM array 10 to DTBR 14 is designated, signal DRT is activated. When data transfer from DTBW 16 to DRAM array 10 is specified, data transfer designating signal DWT attains an active state.

In a data transfer state, DRAM drive circuit 106 sequentially activates signals DPAE, DRTE, DWTE and DWDE required for data transfer according to transfer designating signals DRT and DWT. These signals are identical to those shown in FIG. 26, and their descriptions are not repeated.

By providing clock signal K also to SRAM drive circuit 102 and DRAM drive circuit 106 to operate these circuits in synchronization with clock signal K, a data transfer operation can be carried out in synchronization with the clock signal to achieve a reliable data transfer. Only signals related to data transfer from DRAM control circuit 104 to DRAM drive circuit 106 are shown in FIG. 4. The provision of an activation signal to row decoder 63 and column decoder 64 in DRAM array 10 shown in FIG. 1 from DRAM control circuit 104 is not shown.

Column decoder 74 includes a Y decoder 74a for decoding 4-bit address signal As0–As3, a write decode circuit 74b for receiving a write/read signal W/RZ from SRAM control circuit 100 and an output signal from Y decoder 74, and a readout decode circuit 74c for receiving write/read signal W/RZ from SRAM control circuit 100 and an output signal of Y decoder 74a. Write decode circuit 74b is formed of an AND circuit, and selects a bit specified by Y decoder 74a in a data writing. Readout decode circuit 74c is activated when write/read signal W/RZ designates data readout, and renders decode signal RYW active according to an output signal of Y decoder 74a.

Column decoder 74 further includes a gate 74d for receiving a buffer/SRAM select signal BS and an output signal YW of write decode circuit 74b, and a gate 74e receiving an inverted version of select signal BS and the output signal YW. Gates 74d and 74e are enabled when select signal BS designates a buffer and a SRAM array, respectively.

Output signals SYW, BYW and RYW of column decoder 74 are provided to write driver 51, decoder 52, and preamplifier decoder 56, respectively, shown in FIG. 3. As a result, write driver 51, decoder 52, and preamplifier decoder 56 can be selectively rendered active according to a data writing or reading state. Furthermore, required data can be selected (required data bus from the SRAM data bus can be selected and connected to the data input/output bus).

According to the first embodiment of the present invention, a graphic data readout buffer for storing graphic data used in image processing which is a particular process is additionally provided independently of a data transfer buffer and a SRAM array. Therefore, an efficient graphic data cache of a low cache miss penalty (short waiting time) in accessing program data and graphic data in a time-divisional manner can be implemented.

Particularly, the cache capacity can be increased by storing program data in the SRAM array, so that the cache hit rate can be improved significantly in comparison to the case where program data is stored in the data transfer buffer. Since the data transfer buffer is not used as graphic data cache, the duration of the wait state of CPU or graphic engine upon a program data cache miss can be reduced with no damage of graphic data. Furthermore, degradation in system performance can be prevented. Thus, a high speed semiconductor memory device of high performance suitable for a multimedia system application can be implemented.

Second Embodiment

Figure 5:
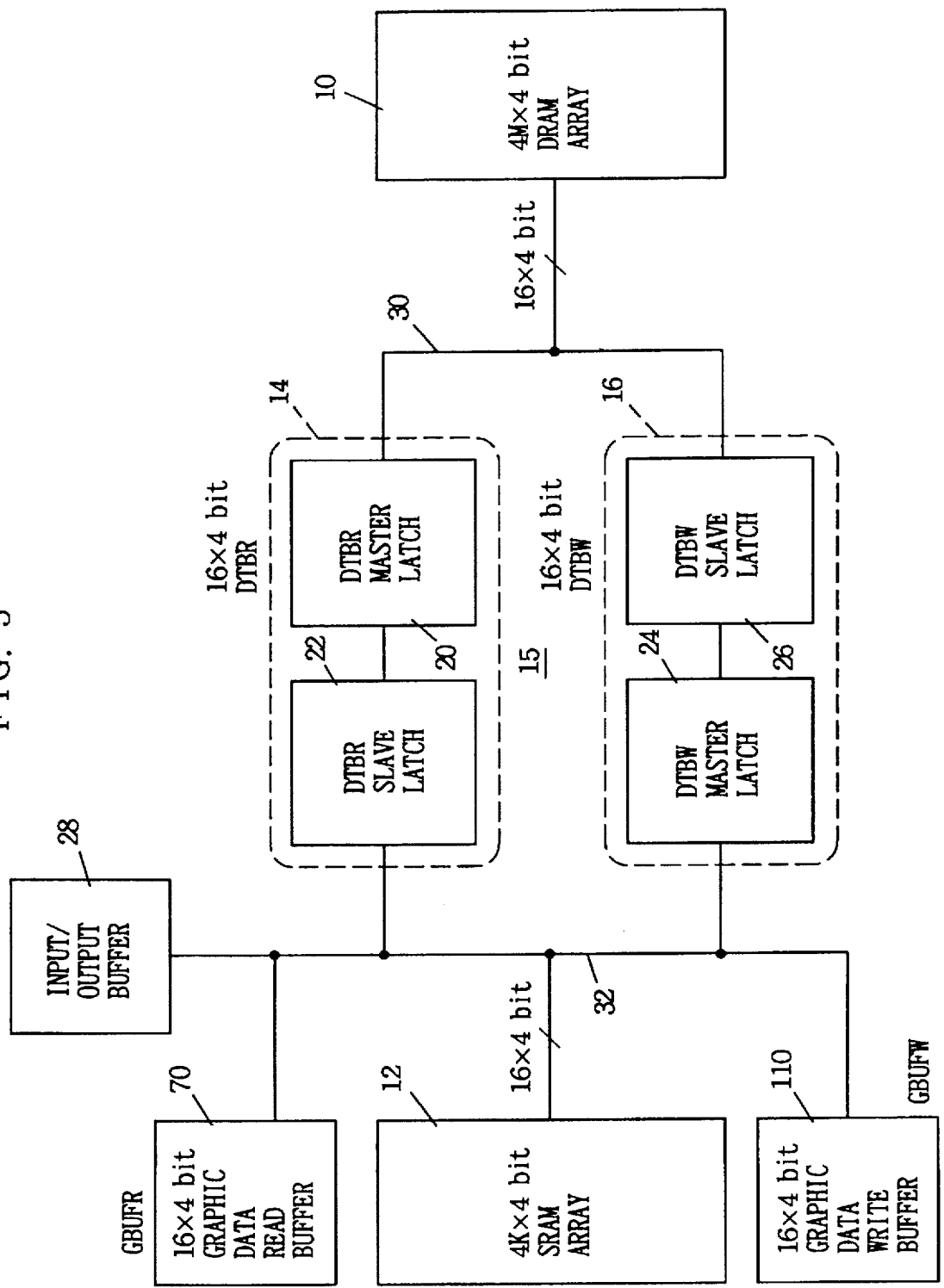
FIG. 5 is a block diagram schematically showing a structure of a main part of a semiconductor memory device according to a second embodiment of the present embodiment of the present invention.

Referring to FIG. 5 showing a structure of a semiconductor memory device according to a second embodiment of the present invention, a graphic write buffer 110 for storing externally processed graphic data is further provided in addition to the structure shown in FIG. 1. Graphic write buffer (GBUFW) 110 has a storage capacity of 16·4 bits similar to that of GBUFR 70, which storage capacity is identical to that of data transfer buffer 15 (DTBR 14 and DTBW 16). GBUFW 110 is coupled to input/output buffer 28 via SRAM data bus 32 (via a selector not shown). Graphic data processed by the graphic engine is written into GBUFW 110 via input/output buffer 28. Graphic data of 16 bits·4 bits stored in GBUFW 110 is transferred into a corresponding position in the graphic data storage region of DRAM array 10 via DTBW 16.

The additional provision of GBUFW 110 provides the following advantage. Graphic data processing is not limited to the process of sequentially reading out graphic data and displaying graphic data on a display screen of an image display unit. For example, in a moving picture processing, an encoding process of graphic data and a decoding process for restoring the current image from coded data are carried out in a block unit. The processed data are stored in the CDRAM in the unit of one field or one frame after graphic data of one screen is reconfigured and then sequentially read out to be displayed or transferred. It is therefore necessary to store the data read out and processed by an external graphic engine again into the graphic data storage region of the CDRAM. The data processed by the graphic engine can be sequentially written into DTBW 16.

However, when CPU program data cache miss occurs in writing graphic data into DTBW 16, unrequired data must be returned to a corresponding region in DRAM array 10 (copy back) from SRAM array 12 while transferring data from DRAM array 10 to SRAM array 12 (transferring data required by the CPU). In this copy back operation, data is transferred from SRAM array 12 to DRAM array 10 via DTBW 16. Therefore, there is a problem that graphic data stored in a DTBW 16 was destructed due to this data transfer. The waiting time of the CPU must be increased in order to avoid this destruction (the CPU must enter a wait state until data is written from the graphic engine and then transferred to a corresponding graphic data storage region of DRAM array 10). In this case, the system performance is degraded.

By providing GBUFW 110 as Shown in FIG. 5 to provide a graphic data storage region for processed data in addition to data transfer buffer 15, the waiting duration of the CPU does not have to be increased even when cache miss of CPU program data occurs during graphic data writing. Furthermore, the written graphic data is not destructed and high speed data processing is allowed. Thus, degradation in system performance can be prevented.

Figure 6:
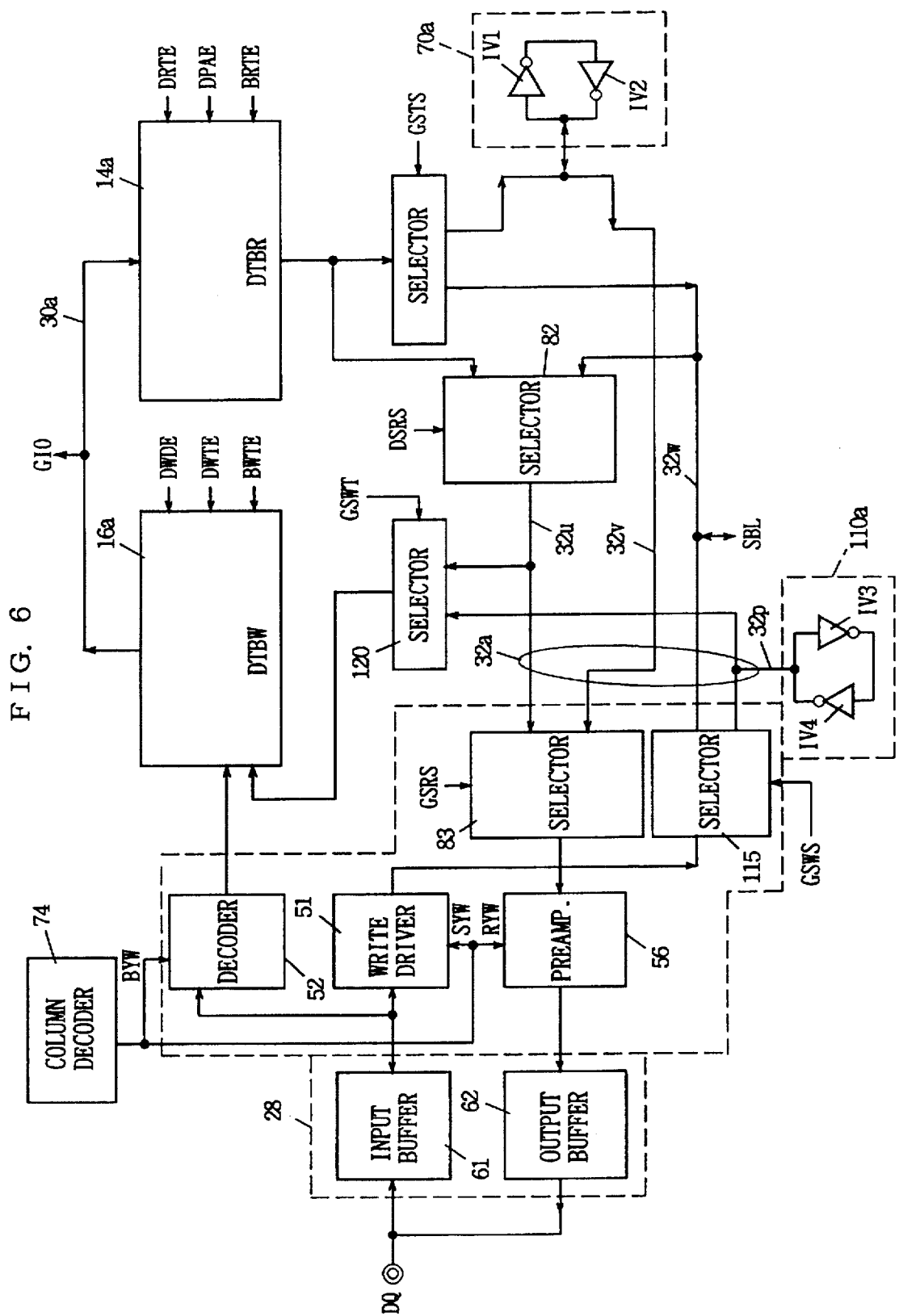
FIG. 6 shows a structure of the portion related to input/output and transfer of 1-bit data of the semiconductor memory device of FIG. 5.

FIG. 6 schematically shows the input/output and transfer portion of 1-bit data of data transfer buffer 15, GBUFR 70, GBUFW 110, and SRAM array 12 shown in FIG. 5. In addition to the structure shown in FIG. 3, the structure of FIG. 6 further includes a selector 115 for transmitting an output signal of write driver 51 to either SRAM bit line 32w or graphic data write line 32a according to select signal GSWS, and a selector 120 for selecting data on graphic data write line 32p or a signal on data bus line 32u from selector 82 according to select signal GSWT and transmitting the selected data to DTBW 16a. DTBW 16a, DTBR 14a and GBUFR 70a each have a storage capacity of one bit. GBUFW 110a of one bit is connected to graphic data write line 32p. Graphic write buffer 110a of one bit includes inverters IV3 and IV4 forming a latch. Data write lines 32u, 32v, 32w and 32p form a SRAM data bus line 32a.

The character "a" attached at the end of a reference numeral is used to emphasize that it relates to data of one bit.

Selector 115 transmits data received from write driver 51 to write data bus line 32p when select signal GSWS indicates that the write data is graphic data. When select signal GSWS indicates that the write data is program data, selector 115 transmits data received from write driver 51 onto SRAM data bus line 32w. When select signal GSWT indicates that the data to be transferred is graphic data, selector 120 selects data from graphic write buffer 110a read out onto write data bus line 32p and transmits the selected data to data transfer buffer (DTBW) 16a. When select signal GSWT indicates that the data to be transferred is the data selected by selector 82 and transmitted onto data bus line 32u, selector 120 selects the data on data bus line 32u and transmits the selected data to data transfer buffer (DTBW) 16a.

The remaining structure is similar to that shown in FIG. 3. Corresponding components have the same reference characters allotted, and their description will not be repeated.

A transfer buffer rendered conductive/non-conductive in response to a transfer designating signal can be provided between write buffer 110a and selector 115.

Figure 7:
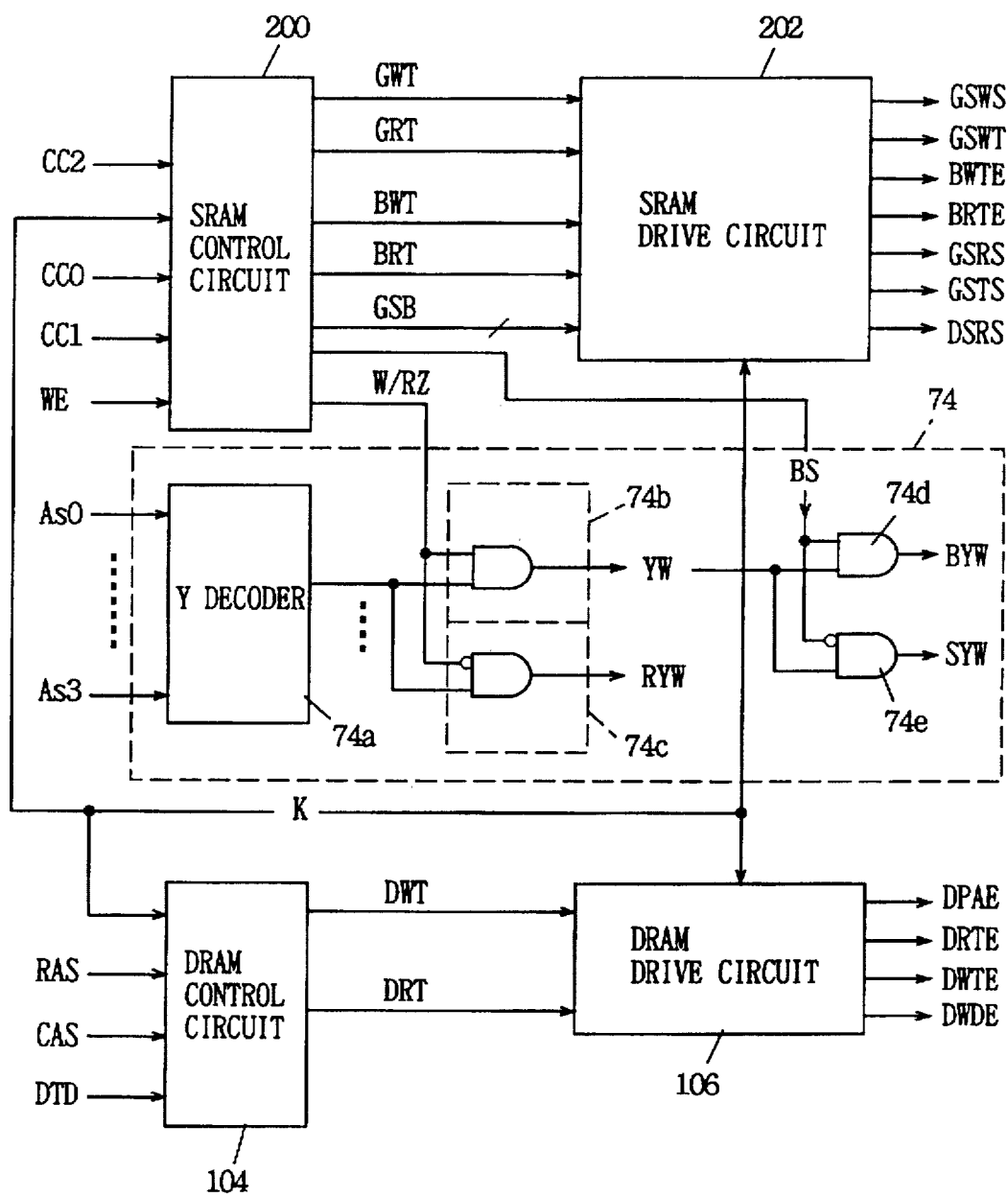
FIG. 7 shows a structure of the portion for generating a control signal shown in FIG. 6.

FIG. 7 shows control circuitry for generating various control signals and select signals shown in FIG. 6. In the structure shown in FIG. 7, the structure of DRAM control circuit 104 and DRAM drive circuit 106 for controlling the DRAM portion is similar to that shown in FIG. 4. More specifically, in column decoder 74 in a data writing mode, one of gates 74d and 74e responds to select signal YW from decoder 74b to render either signal BYW or SYW active according to a signal BS from SRAM control circuit 200 indicating whether or not data is to be written into the data transfer buffer.

In addition to the structure of the first embodiment, SRAM control circuit 200 responds to a signal CC2 and a write/read signal WE for providing transfer designating signals GRT and GWT indicating data transfer between GBUFR 70 or GBUFW 110 and DRAM array 10. SRAM drive circuit 202 responds to control signals GWT, GRT, BWT, BRT, and GSB from SRAM control circuit 200 to set signals GSWS, GSWT, BWTE, BRTE, GSRS, GSTS, and DSRS to respective predetermined states.

When the combination of the states of signals CC0–CC2 and WE at a rise of clock signal K designates data writing to GBUFW 110, SRAM control circuit 200 sets signal GSB to a predetermined state to instruct data writing to GBUSW 110 (in this case, signal GSB is represented by a plurality of bits in order to specify any of SRAM array 10, GBUFW 110, and DTBW 16 as the writing destination together with designation of data writing/reading). When transfer designating signals GWT, GRT, BWT and BRT all attain an inactive state, and signal GSB specifies data writing to GBUFW 110, SRAM drive circuit 202 sets signal GSWS to a predetermined state, and selector 115 sets to select graphic data write data bus line 32p. When signal GSBW designates data writing to SRAM array 12, SRAM drive circuit 202 sets the state of signal GSWS such that selector 115 transmits a write data from write driver 51 to SRAM data bus line 32w.

When signal GSB instructs data writing to DTBW 16, SRAM drive circuit 202 renders signal BWTE inactive to set a state for storing data from decoder 52 as shown in FIG. 6 in a master latch circuit in DTBW 16. When data transfer from GFUBW 110 to DRAM array 10 is specified by signals CC2 and WE, SRAM control circuit 200 renders signal GWT active. SRAM drive circuit 202 responds to signal GWT to set signal GSWT to a predetermined state under which selector 120 selects graphic data from GFUBW 110, and also renders transfer designating signal BWTE active. As a result, data of 16 bits-4 bits stored in GFUBW 110 are transferred to DTBW 16 at one time.

The states of the remaining control signals are identical to those shown in and described with reference to FIG. 4.

According to the above-described structure, data can be written into GBUFW 110 and transferred from GBUFW 110 to DRAM array 10 properly without adversely affecting the CPU access to program data even when a graphic data write buffer for graphic data storage is additionally provided.

According to the second embodiment of the present invention, a write buffer for storing graphic data is further provided in addition to a buffer for graphic data readout. Therefore, even when a CPU cache miss occurs in writing graphic data, the data required by the CPU can be transferred from the DRAM array to the SRAM array without destructing the written graphic data. Furthermore, the wait time period of the CPU can be reduced to prevent degradation of the system performance.

Third Embodiment

Figure 8:
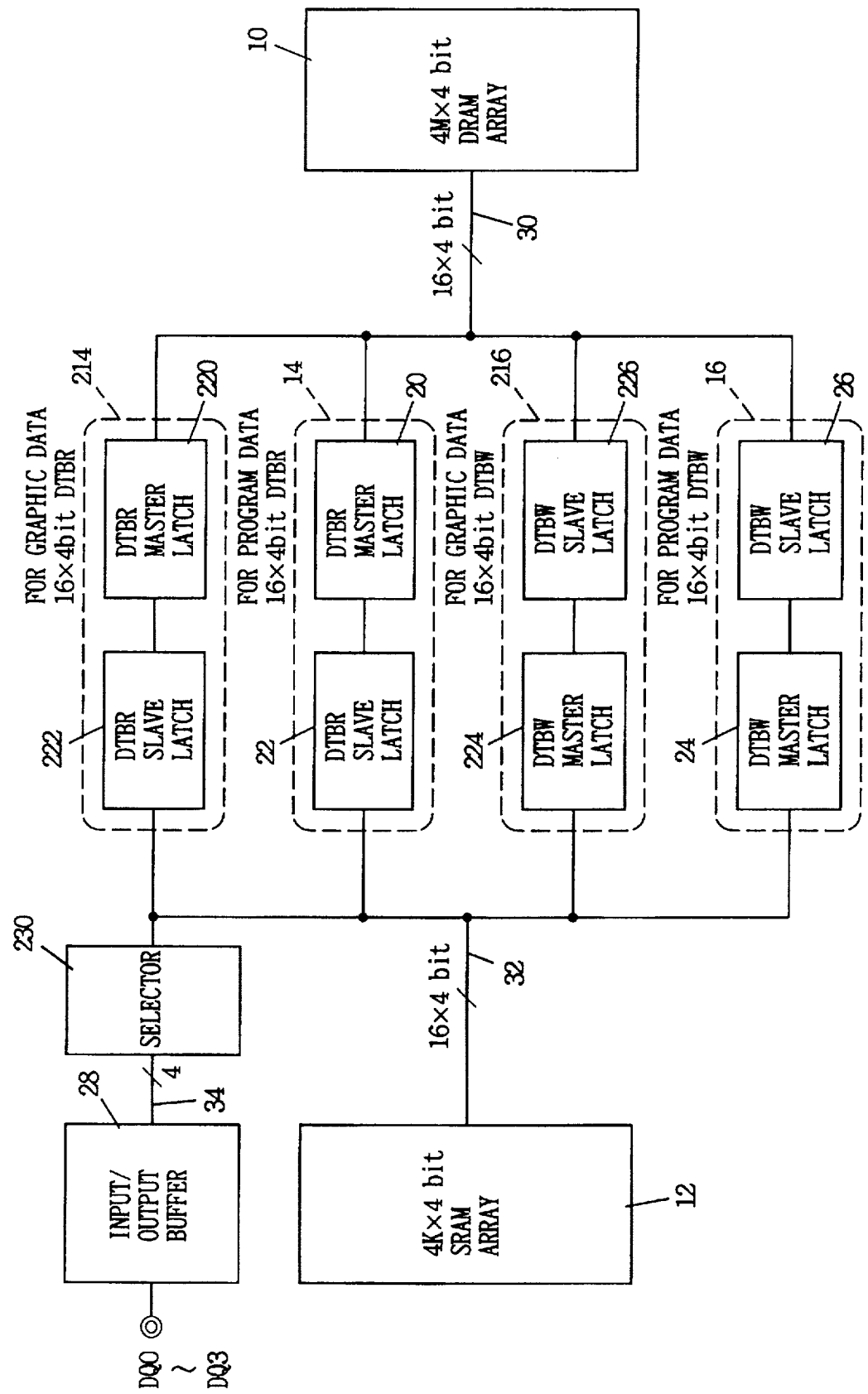
FIG. 8 schematically shows a structure of a main part of a semiconductor memory device according to a third embodiment of the present invention.

FIG. 8 shows a structure of a main part of a semiconductor memory device according to a third embodiment of the present invention. Referring to FIG. 8, a graphic DTBR (graphic data transfer buffer) 214 is additionally provided between a DRAM data bus 30 and an SRAM data bus 32 in parallel to DTBR 14. Furthermore, a graphic data DTBW (graphic data transfer buffer) 216 is provided in parallel to DTBW 16. SRAM data bus 32 is selectively coupled to data input/output bus 34 of 4 bit width via a selector 230. Data input/output bus 34 is connected to an input/output buffer 28 to or from which data of 4 bits DQ0–DQ3 are provided.

DTBR 14 and DTBW 16 store and transfer program data used by the CPU. Graphic data DTBR 214 and DTBW 216 store and transfer graphic data used by the graphic engine. Graphic data transfer buffers (DTBR, DTBW) 214 and 216 transfer and receive data to and from DRAM array 10 via DRAM data bus 30, and performs data transfer with input/output buffer 28 via a selector 230.

In writing graphic data, graphic data is written into graphic data DTBW 216. When the writing operation of one block (16-4 bits), or required data of one block is completed, write data stored in this graphic data DTBW 216 is transferred into a corresponding region in the graphic data storage region of DRAM array 10.

In reading out graphic data, the data stored in graphic DTBR 214 is read out via selector 230 and input/output buffer 28. When read out of storage data of DTBR 214 is completed, graphic data of the next block to be processed in the graphic data storage region of DRAM array 10 is transferred toward DTBR 214.

The writing, reading and transfer operation of program data are carried out in a manner similar to those of the first and second embodiments. By using a buffer with a structure identical to that of the data transfer buffer that transfers data between SRAM array 12 and DRAM array 10 for storing graphic data, the following advantages can be obtained.

Control of data transfer and access of DTBRs 14 and 214 and DTBWs 16 and 216 can be carried out by the generation of control signals at the same timing except for whether the transfer or access data is program data or graphic data. Therefore, by receiving an external data indicating whether the data under process is program data or graphic data, the control signals for the DTBR and DTBW related to the data under process are rendered active by identifying the type of data under process (program data or graphic data). Therefore, the structure of control circuitry for data transfer and access can be simplified. A structure of this control circuit will be described afterwards.

Graphic DTBR 214 is formed of a master latch 220 for receiving and storing data from DRAM array 10, and a slave latch 220 for receiving data stored in a master latch 220 and providing received data to a selector 230. Graphic DTBW 216 includes a master latch 224 for storing data provided via selector 230, and a slave latch 226 for receiving data stored in master latch 224 and transferring the same to DRAM array 10 via DRAM data bus 30. DTBR 14 and DTBW 16 storing program data have a structure similar to those shown in the first and second embodiments. Therefore, DTBRs 14 and 214 and DTBWs 16 and 216 respectively includes the same structure of a master and a slave latch. Furthermore, DTBR 214 and DTBW 216 have a storage capacity (16 bit-4 bit) identical to those of DTBR 14 and DTBW 16.

Figure 9:
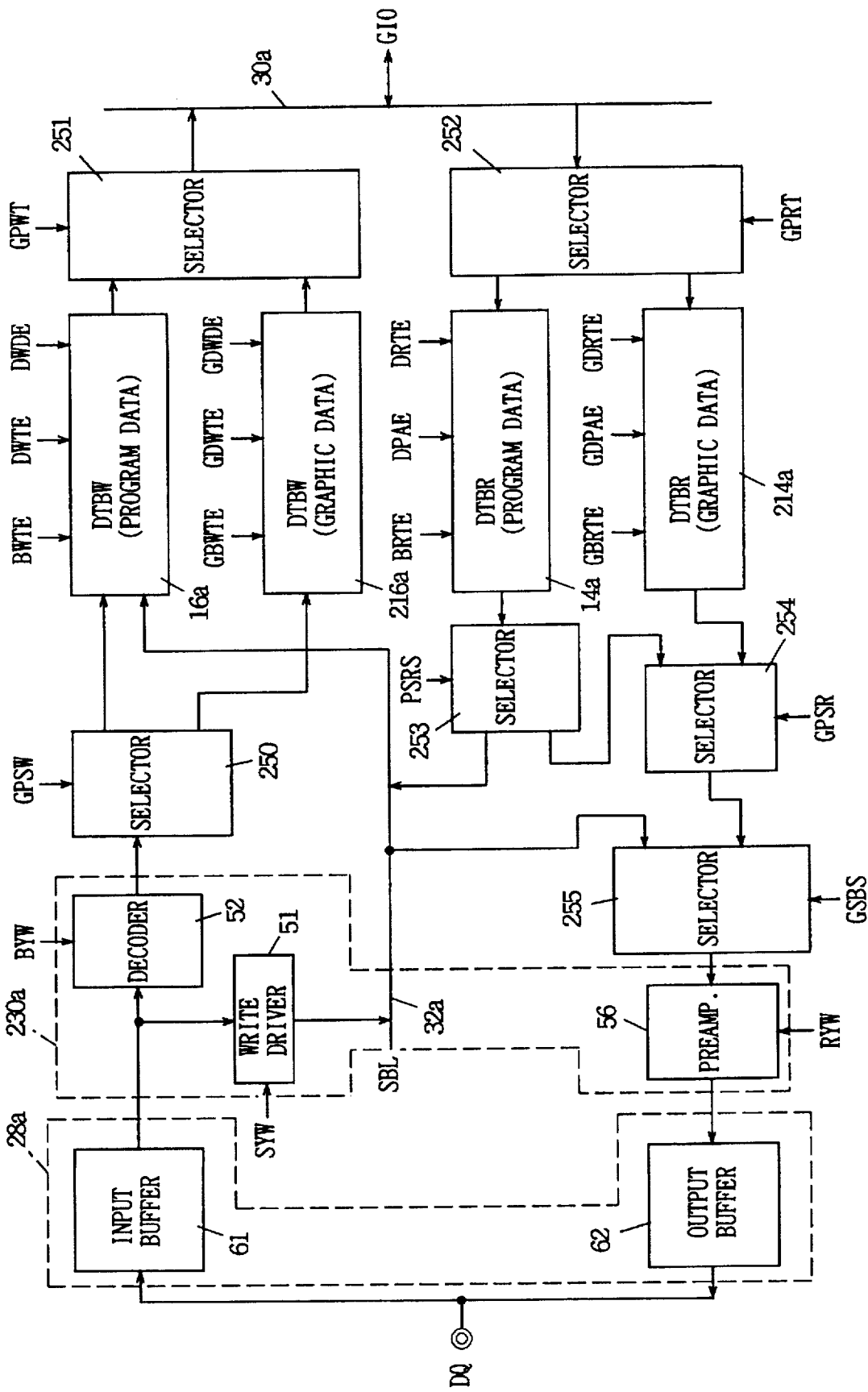
FIG. 9 shows a structure of the portion related to data input/output of one bit of the semiconductor memory device of FIG. 8.

FIG. 9 is a block diagram showing a structure of the portion related to input/output and transfer of 1-bit data according to the structure of FIG. 8. Referring to FIG. 9, a DTBW 16a that transmits program data of one bit to the DRAM array (global I/O line GIO) operates in response to transfer control signals BWTE, DWTE, and DWDE. These signals are identical to those used in the first and second embodiments.

DTBW 216a of one bit for storing externally applied graphic data and transferring the graphic data to DRAM array 10 operates in response to transfer control signals GBWTE, GWTE, and GWDE. Transfer control signals GBWTE, GDWTE and GWDE are generated at timings identical to those of transfer control signals BWTE, DWTE and DWDE when the data to be processed is graphic data. More specifically, when transfer control signal GDWTE is active, externally applied graphic data is transferred into the master latch of DTBW 216a. Transfer control signal GDWTE controls the data transfer from the slave latch to the master latch of DTBW 216a of one bit. Transfer control signal GDWDE activates a preamplifier provided in the output portion of DTBW 216a of one bit to output data stored in the master latch circuit. The data provided from 1-bit DTBW 16a or 1-bit DTBW 216a is transferred to a 1-bit DRAM data bus 30a via a selector 251.

Selector 251 responds to a select control signal GPWT to select output data of either 1-bit DTBW 16a or 1-bit DTBW 216a. This select control signal (graphic/program write select control signal) GPWT is rendered active in transferring data from DTBWs 16 and 216 to DRAM array 10 and is set to a state for selecting either DTBW 16 or DTBW 216a. When a data transfer operation is not carried out, selector 251 is set to an output high impedance state. Selector 251 may be set to a state in which an output signal of either 1-bit DTBW 16a or 1-bit DTBW 216a is constantly selected. In this case, 1-bit DTBW 16a and 1-bit DTBW 216a are set to an output high impedance state when signals DWDE and GDWDE are inactive, so that there is no problem.

1-bit DTBR 14a for storing/transferring program data operates in response to data control signals BRTE, DPAE and DRTE. These control signals are identical to those shown in the first and second embodiments.

1-bit DTBR 214a storing graphic data operates in response to transfer control signals GBRDE, GDPAE and GDRTE. These control signals are activated when graphic data is the object to be processed, and has the same purpose as transfer control signals BRTE, DPAE and DRTE. Data is transferred from DRAM data bus 30a to 1-bit DTBR 14a and 1-bit DTBR 214a via a selector 252. Selector 252 responds to a control signal GPRT rendered active upon data transfer to transmit data provided from DRAM data bus 30a to either 1-bit DTBR 14a or 1-bit DTBR 214a. Since 1-bit DTBR 14a and 1-bit DTBR 214a do not latch data transmitted from selector 252 when transfer control signals DRTE and GDRTE are inactive, selector 252 may be set to a state in which either DTBR 14a or DTBR 214a is constantly selected.

It is to be noted that selectors 251 and 252 do not have to be provided necessarily. This is because DTBWs 16a and 216a amplify and provide the storage data when transfer control signals GWDE and GDWDE are active, and are set to an output high impedance state when transfer control signals GWDE and GDWDE are inactive. Similarly, data transfer will not be carried out erroneously even if selector 252 is not provided since 1-bit of DTBR 14a and 1-bit DTBR 214a do not latch an applied data when transfer control signals DRTE and GDRTE are inactive.

Similar to the structure of the first and second embodiments, a select circuit 230a of one bit in selector 230 of FIG. 8 includes a write driver 51 activated in response to an active control signal SYW to amplify data provided from input buffer 61 and transmitting the amplified data to SRAM data bus 32a, a decoder 52 rendered conductive in response to a select signal BYW for passing therethrough data applied from input buffer 61, and a preamplifier 56 activated in response to an active control signal RYW to amplify applied data and transmitting the amplified data to output buffer 62.

The data provided from decoder 52 is applied to either 1-bit DTBW 16a or 1-bit DTBW 216a via selector 250. When select control signal GPSW indicates program data, selector 250 transmits the data provided from decoder 52 to 1-bit DTBW 16a. When transfer control signal GPSW indicates graphic data, selector 250 transmits the data from decoder 52 to 1-bit DTBW 216a. Different from 1-bit DTBW 16a, the data from SRAM array 12 is not transmitted in 1-bit DTBW 216a. Therefore, transfer control signal GBWTE for 1-bit DTBW 216a (216) always attains an inactive state. When data is transferred from selector 250, 1-bit DTBR 16a stores the applied data into the slave latch circuit therein. When control signal BWTE attains an active state, 1-bit DTBW 16a stores data transmitted from SRAM data bus line 32a into the slave latch circuit therein.

A selector 253 for switching the transfer path is provided at the data output portion of 1-bit DTBR 14a. When select control signal PSRS indicates data transfer from DRAM array 10 to SRAM array 12, selector 253 transmits the data from 1-bit DTBR 14a onto SRAM data array bus line 32a. When select control signal PSRS instructs data readout, selector 253 transmits data from DTBR 14a to selector 254.

Selector 254 receives data transmitted from selector 253 and a data signal from 1-bit DTBR 214a to select either of the received data according to select control signal GPSR. When select control signal GPSR indicates program data, selector 254 selects data transmitted from selector 25e. When select control signal GPSR indicates graphic data, selector 254 selects data from 1-bit DTBR 214a. The output data from selector 254 is provided to preamplifier 56 via selector 255. When select control signal GSBS indicates SRAM array 12, selector 255 selects the data on SRAM data bus line 32a to provide the selected data to preamplifier 56. When select control signal GSBS indicates the data transfer buffer, selector 255 selects and provides to preamplifier 56 the data provided from selector 254.

When data of DTBR 14 is to be read out to the outside world simultaneously with data transfer from DTBR 14 to SRAM array 12, selector 253 transmits the data in 1-bit DTBR 14a onto SRAM data bus line 32a, and selector 255 selects the data on SRAM data bus line 32a and provides the selected data to preamplifier 56.

Figure 10:
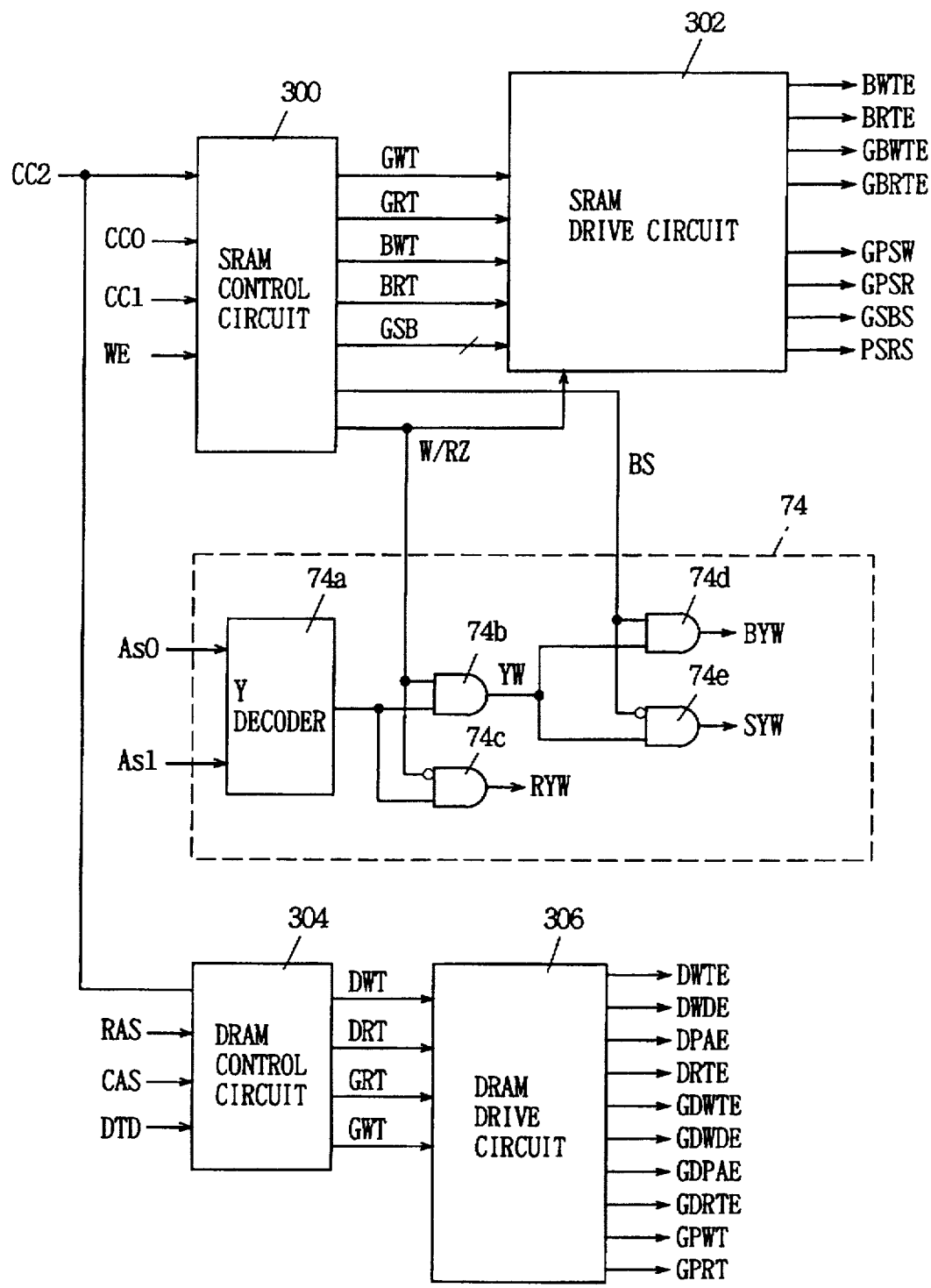
FIG. 10 shows a structure of the portion for generating a control signal shown in FIG. 9.

FIG. 10 shows a structure of a control unit for generating control signals shown in FIG. 9. Referring to FIG. 10, a column decoder 74 has a structure similar to that shown in the first and second embodiments. Corresponding components have the same reference characters allotted. In writing data, column decoder 74 responds to a write destination designating signal BS from SRAM control circuit 300 to render active either control signal BYW provided to the decoder or control signal SYW provided to the write driver.

The control of data input/output to and from data transfer buffers 14, 16, 214, and 216 and to and from SRAM array 12, and data transfer between SRAM array 12 and data transfer buffers 14, 16 are carried out by SRAM control circuit 300 and SRAM drive circuit 302. SRAM control circuit 300 responds to externally applied control signals CC0–CC2 and write/read designation signal WE to provide signals GWT, GRT, BWT and BRT, an access object designating signal GSB, a write object designating signal BS and a write/read designating signal W/RZ. Transfer designating signal GWT specifies data transfer from DTBW 216 storing graphic data to DRAM array 10. Transfer designating signal GRT specifies graphic data transfer from DRAM array 10 to GTBR 214 storing graphic data. Transfer designating signal BWT specifies data transfer from DTBW 16 storing program data toward DRAM array 10. Transfer designating signal BRT specifies data transfer from DRAM array 10 towards DTBR 14 storing program data. Access object designating signal GSB specifies whether the data to be accessed is in the SRAM array, or in the graphic data transfer buffer, in the program data transfer buffer. Signal BS specifies whether the data to be written (including both program data and graphic data) is in the SRAM array or in the data transfer buffer.

SRAM control circuit 300 generates a control signal defining an internal operation in accordance with the combination of the states of external control signals CC0–CC1 and signal WE at a rise of clock signal K. This external clock signal K is not shown in FIG. 10. Control signal CC2 specifies whether the data to be processed is program data or is graphic data. Control signals CC0 and CC1 specify whether or not data transfer is to be carried out, and also the direction of the data transfer. Write/read designating signal WE specifies whether external data is to be written or is to be read out.

SRAM drive circuit 302 responds to transfer designating signals GWT, GRT, BWT and BRT from SRAM control circuit 300, access destination designating signal GSB, and write/read designating signal W/RZ for setting transfer control signals BWTE, BRTE, GBWTE, and GBRTE, select signals GPSW, GPSR, GSBS and PSRS to respective predetermined states. When data transfer designating signals GWT, GRT, BWT and BRT all attain an inactive state, SRAM drive circuit 302 sets select control signals GBSW, GPSR, GSBS and BSRS to specified states according to access object designating signal GSB and write/read designating signal W/RZ. When data transfer is to be carried out, transfer control signals BWTE, BRTE, GBWTE and GBRTE are set to respective states determined according to signal CC2. Here, when data write/read is carried out, select control signals GPSW, GPSR, GSBS and PSRS are set to predetermined states together.

Data transfer between data transfer buffers 14, 16, 214 and 216 and DRAM array 10 is controlled by DRAM control circuit 304 and DRAM drive circuit 306. DRAM control circuit 304 responds to control signals CC2, RAS, CAS and DTD for providing internal transfer designating signals DWT, DRT, GRT and GWT. Identification of which of program data and graphic data is to be transferred is made by control signal CC2. The data transfer direction is determined by control signal DTD. According to the combination of the states of signals RAS and CAS, identification is made whether a memory cell data is only selected in DRAM array 10, or whether data transfer is carried out.

DRAM drive circuit 306 responds to transfer control signals DWD, DRT, GRT and GWT from DRAM control circuit 304 to set transfer control signals DWTE, DWDE, DPAE, DRTE, GWTE, GDWDE, GDPAE, and GDRTE and select control signals GPWT and GPRT to predetermined states.

Similarly, SRAM drive circuit 302 and DRAM drive circuit 306 set each control signal to respective defined states in response to internal clock signal K. The transmission path of this clock signal is not shown. By generating each signal in response to clock signal K, the determination of the data transfer operation timing is facilitated.

According to the third embodiment of the present invention, a transfer buffer for writing/reading graphic data is provided in parallel to a buffer for program data transfer. Therefore, program data can be transferred between DRAM array 10 and SRAM array 12 in parallel to writing/reading out graphic data. Increase in the duration of the wait state of the CPU when program data cache miss occurs can be suppressed. Furthermore, it is not necessary to temporarily save the graphic data into DRAM array 10. Therefore, transfer of program data between SRAM array 12 and DRAM array 10 can be carried out speedily with no damage of graphic data.

The data transfer buffer for storing and transferring graphic data has a capacity that can store the data bits that are transferred by one time data transfer operation between DRAM array 10 and SRAM array 12. Therefore, a cache memory having a memory capacity optimum for graphic data can be implemented.

Fourth Embodiment

Figure 11:
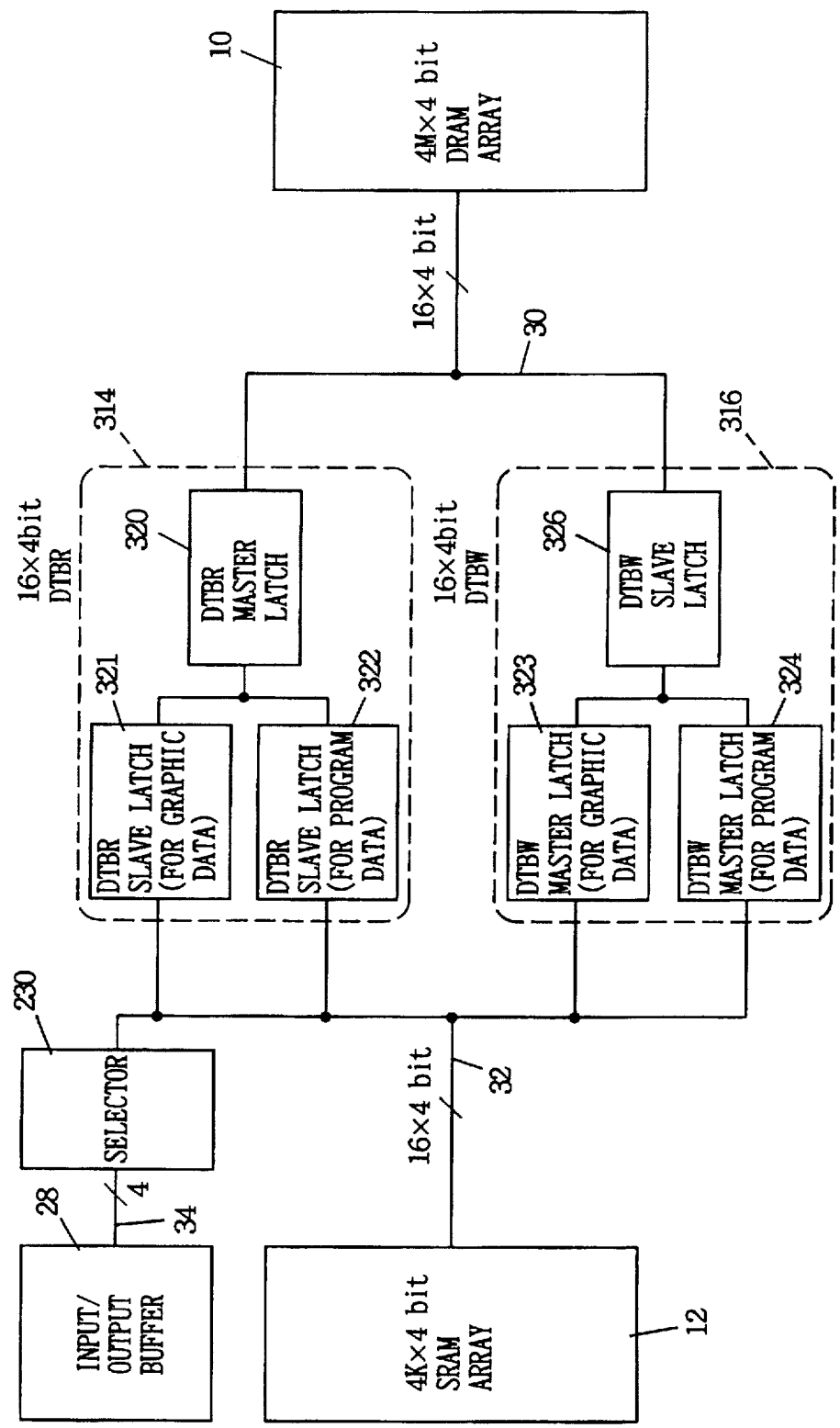
FIG. 11 schematically shows a structure of a main part of a semiconductor memory device according to a fourth embodiment of the present invention.

FIG. 11 schematically shows a structure of a main part of a semiconductor memory device according to a fourth embodiment of the present invention. Referring to FIG. 11, a data transfer buffer (DTBR) 314 receiving data transferred from DRAM array 10 includes a master latch 320 for receiving data provided from DRAM array 10 via DRAM data bus 30, an graphic data slave latch 321 for storing graphic data provided from master latch 320, and a program data slave latch 322 for storing program data provided from master latch 320.

A data transfer buffer (DTBW) 316 for transferring data to DRAM array 10 includes a graphic data master latch 323 for storing graphic data provided via SRAM data bus 32, a master latch 324 for storing program data provided via SRAM data bus 32, and a slave latch 326 coupled to master latches 323 and 324 for transferring data provided therefrom to DRAM array 10 via DRAM data bus 30.

Slave latches 321, 322, 326 and master latches 320, 323, and 324 each have a storage capacity of 16·4 bits.

According to the structure shown in FIG. 11, DTBR 314 has the master latch receiving graphic data from DRAM array 10 and the master latch receiving program data from DRAM array 10 implemented by one master latch 320. Similarly, the slave latch for transferring graphic data to DRAM array 10 and the slave latch for transferring program data to DRAM array 10 are implemented by one slave latch 326. Therefore, the occupying area of the data transfer buffer can be reduced in comparison to that shown in FIG. 8. The transfer of program data between DRAM array 10 and SRAM array 12, the readout of program data from DTBR 314 (slave latch 322), and the writing of program data into DTBW (master latch 324) are identical in operation to those of the first to third embodiments. Similarly, transfer of graphic data between DRAM array 10 and the data transfer buffer and the writing/readout operation of graphic data are identical in operation to those in the previous embodiments.

In the structure shown in FIG. 11, graphic data is stored in slave latch 321 of DTBR 314 and also in master latch 323 of DTBW 316. Therefore, there is no destruction of the graphic data even if CPU program data is transferred using master latch 320 and slave latch 326 in the case of a CPU cache miss. For example, graphic data is transferred to slave latch 321 when graphic data is stored in master latch 320. Even when the graphic data stored in master latch 320 is rewritten by CPU program data, there is no problem since the required graphic data is already stored in slave latch 321. As to slave latch 326, the graphic data stored therein is already transferred to DRAM array 10. The next graphic data to be transferred is stored in master latch 323. Therefore, even if the graphic data stored in slave latch 326 is rewritten by CPU program data as a result of program data transfer from SRAM array 12 to DRAM array 10 using master latch 324 and slave latch 326, there is no problem since the graphic data is already stored in a corresponding region in DRAM array 10.

Figure 12:
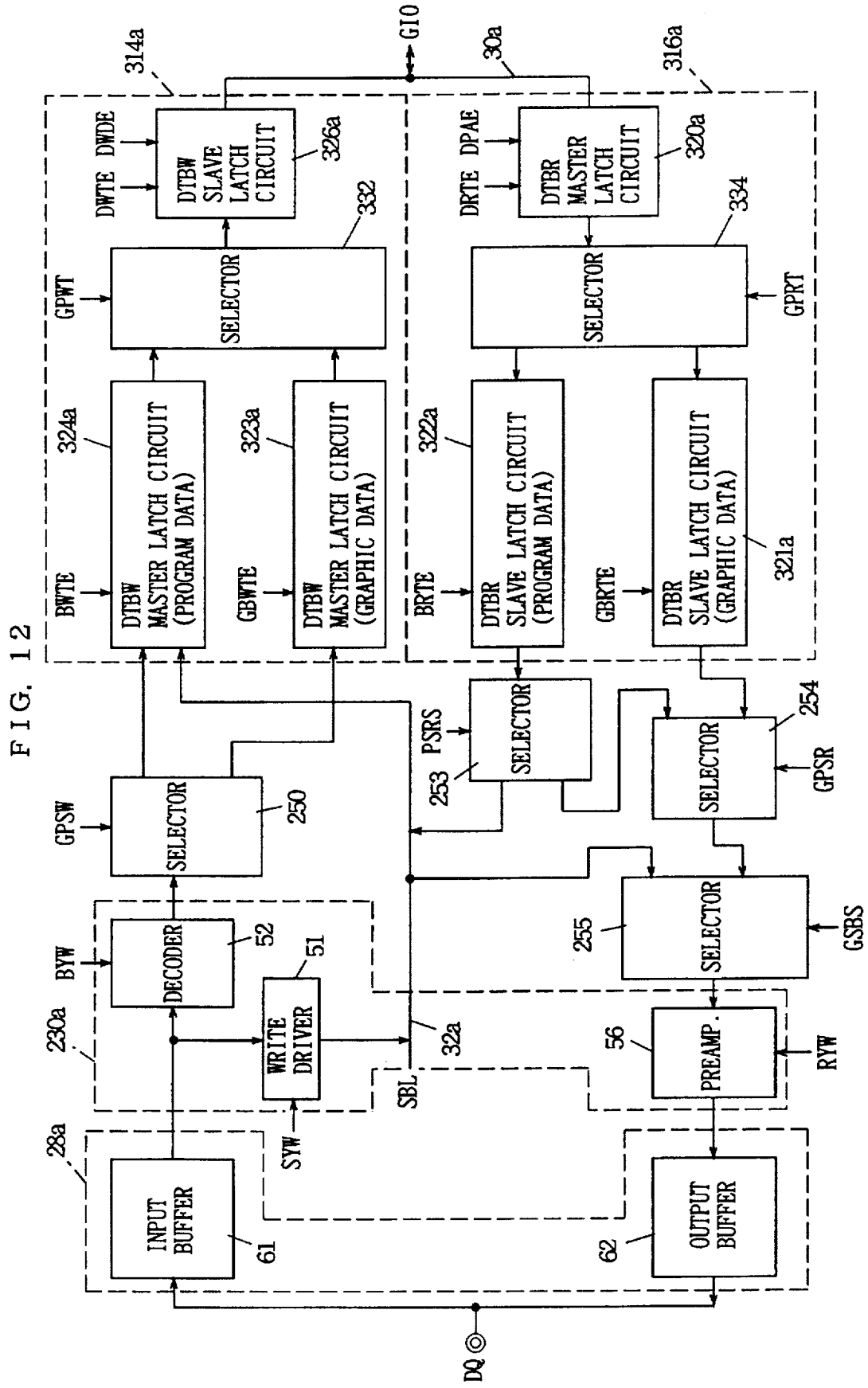
FIG. 12 shows a structure of a part related to input/output data of 1 bit of the semiconductor memory device of FIG. 11.

FIG. 12 is a diagram showing a structure of the portion related to data input/output and transfer of 1-bit data of the semiconductor memory device of FIG. 11. Referring to FIG. 12, a 1-bit data transfer buffer (DTBW) 314a includes a master latch 324a responsive to a transfer control signal BWTE for incorporating data on SRAM data bus line 32a and latching write data provided from decoder 52 via selector 250, a master latch circuit 323a for latching write graphic data provided from decoder 52 via selector 250, a selector 332 for selecting data of one of master latch circuits 324a and 323a, and a slave latch circuit 326a for latching a data signal output from selector 332 and providing the same to DRAM data bus line 30a. Selector 332 responds to a select control signal GPWT to select an output data signal of one of master latch circuits 324a and 323a. Slave latch circuit 326a responds to transfer control signals DWTE and DWDE for latching and transferring the applied data. Transfer control signal GBWTE provided to master latch circuit 323a that stores graphic data always attains an inactive state. This master latch circuit 323a serves to latch only the write graphic data provided from decoder 52 via selector 210.

1-bit DTBR 316a includes a master latch circuit 320a for incorporating and latching data on DRAM data bus line 30a, a slave latch circuit 322a for storing program data from master latch circuit 320a, a slave latch circuit 321a for storing graphic data from master latch circuit 320a, and a selector 334a for transmitting a data signal output from master latch circuit 320a to one of slave latch circuits 321a and 322a. Master latch circuit 320a responds to transfer control signals DPAE and DRTE for incorporating and transferring a data signal on DRAM data bus line 30a. Selector 334 forms a transfer path according to select control signal GPRT. Slave latch circuit 322a responds to transfer control signal BRTE to transmit the latched data to selector 253. Slave latch circuit 321a transmits the latched data to one input of selector 254, according to transfer control signal GBRDE.

The structure of master latch circuits 323a and 324a and slave latch circuits 321a and 322a are similar to those of the third embodiment. The structure of the components provided between DTBRs 314a and 316a and input/output buffer 28a is identical to that shown in FIG. 9. Corresponding components have the same reference characters allotted, and their description will not be repeated.

Selectors 332 and 334 substantially provide a function equivalent to that of selectors 251 and 252 shown in FIG. 9. Selector 332 selects an output data signal of master latch circuit 324a when select control signal GPWT indicates program data. Selector 332 selects data signal output from master latch circuit 323a when select control signal GPWT indicates graphic data.

Selector 334 transmits an output data signal from master latch circuit 320a to slave latch circuit 322a and to slave latch circuit 321a when select control signal GPRT indicates program data and graphic data, respectively. Thus, the function of select control signals GPWT and GPRD are identical to those of select control signals shown in FIG. 9.

Figure 13:
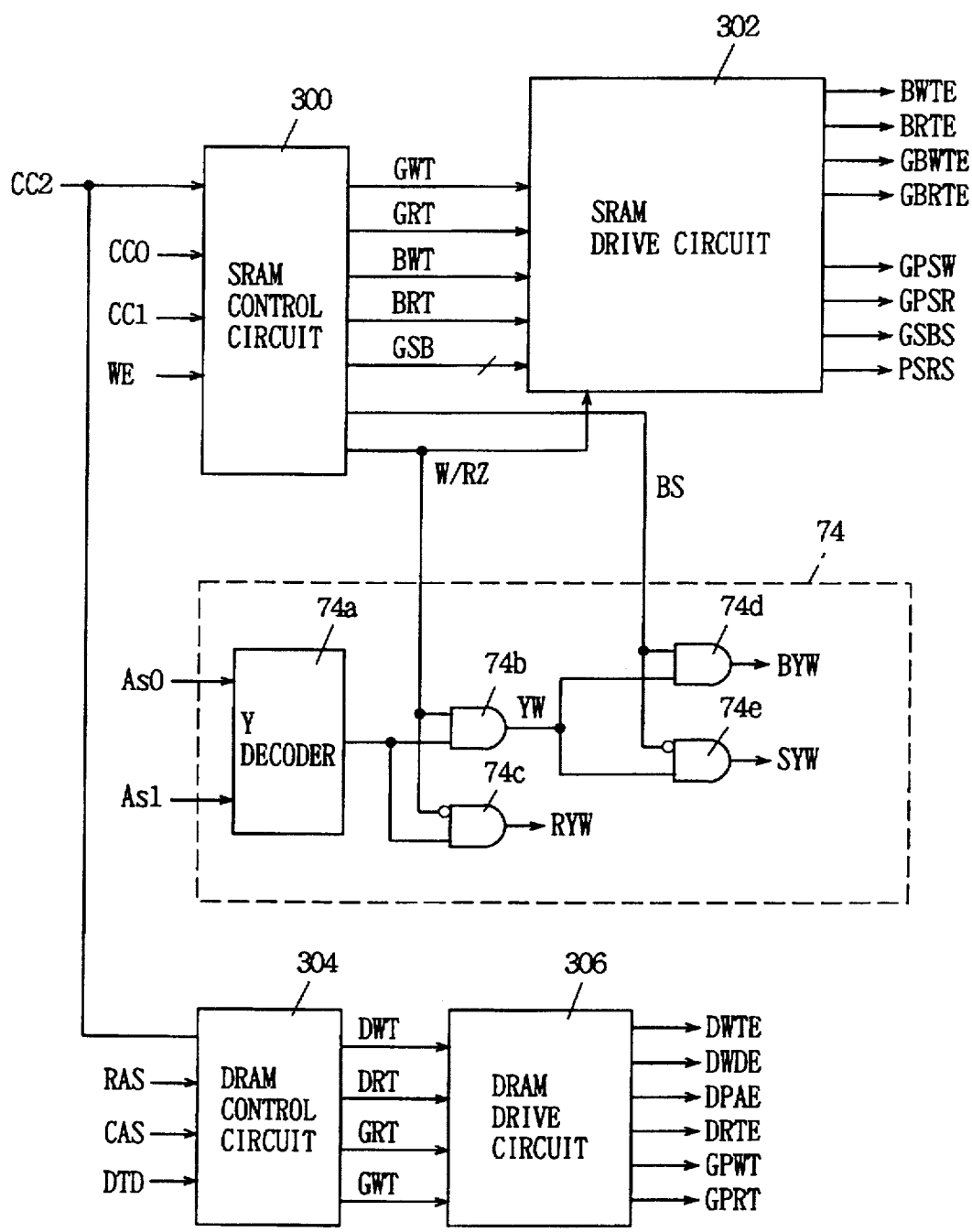
FIG. 13 shows a structure of the portion for generating a control signal shown in FIG. 12.

FIG. 13 shows a structure of the portion for generating control signals shown in FIG. 12.

In FIG. 13, SRAM control circuit 300 and SRAM drive circuit 302 have structures identical to those of SRAM control circuit 300 and SRAM drive circuit 302 of FIG. 10. Similarly, column decoder 74 has a structure identical to that shown in FIG. 10. This is because the structure of the portion of the data transfer buffer (DTBR and DTBW), the data input/output unit and the SRAM array is substantially identical to that shown in the third embodiment.

The structure of DRAM drive circuit 306 that operates in response to an output signal of DRAM control circuit 304 slightly differs since slave latch 316 of DTBW 314 and master latch 320 of DTBR are commonly used to store program data and graphic data. In contrast to the structure shown in the third embodiment, DRAM drive circuit 306 provides transfer control signals DWTE, DWDE, DPAE and DRTE and select control signals GTWT and GPRT. Since program data and graphic data are transferred by the common slave latch, signals DWTE and DWDE controlling the transfer operation of the slave latch of the DTBW are used both for program data and for graphic data. Similarly, signals DPAE and DRTE for controlling data transfer of DTBR master latch 320 are used in common for the transfer of both program data and graphic data. The control of the transfer path of program data and graphic data is implemented by select control signals GPWT and GPRT.

Therefore, the structure of DRAM control circuit 304 is substantially identical to that shown in FIG. 10. The state of select control signals GPWT and GPRT are determined according to whether the transfer data is graphic data or is program data on the basis of control signal CC2.

In the structure of the fourth embodiment of the present invention, the slave latch circuit and the master latch circuit coupled to the DRAM data bus are so arranged as to be used to latch both program data and graphic data. Therefore, the area occupied by the data transfer buffer can be reduced to realize a semiconductor memory device of a smaller occupying area. Furthermore, meritorious advantages similar to those of the third embodiment can be achieved.

Fifth Embodiment

Figure 14:
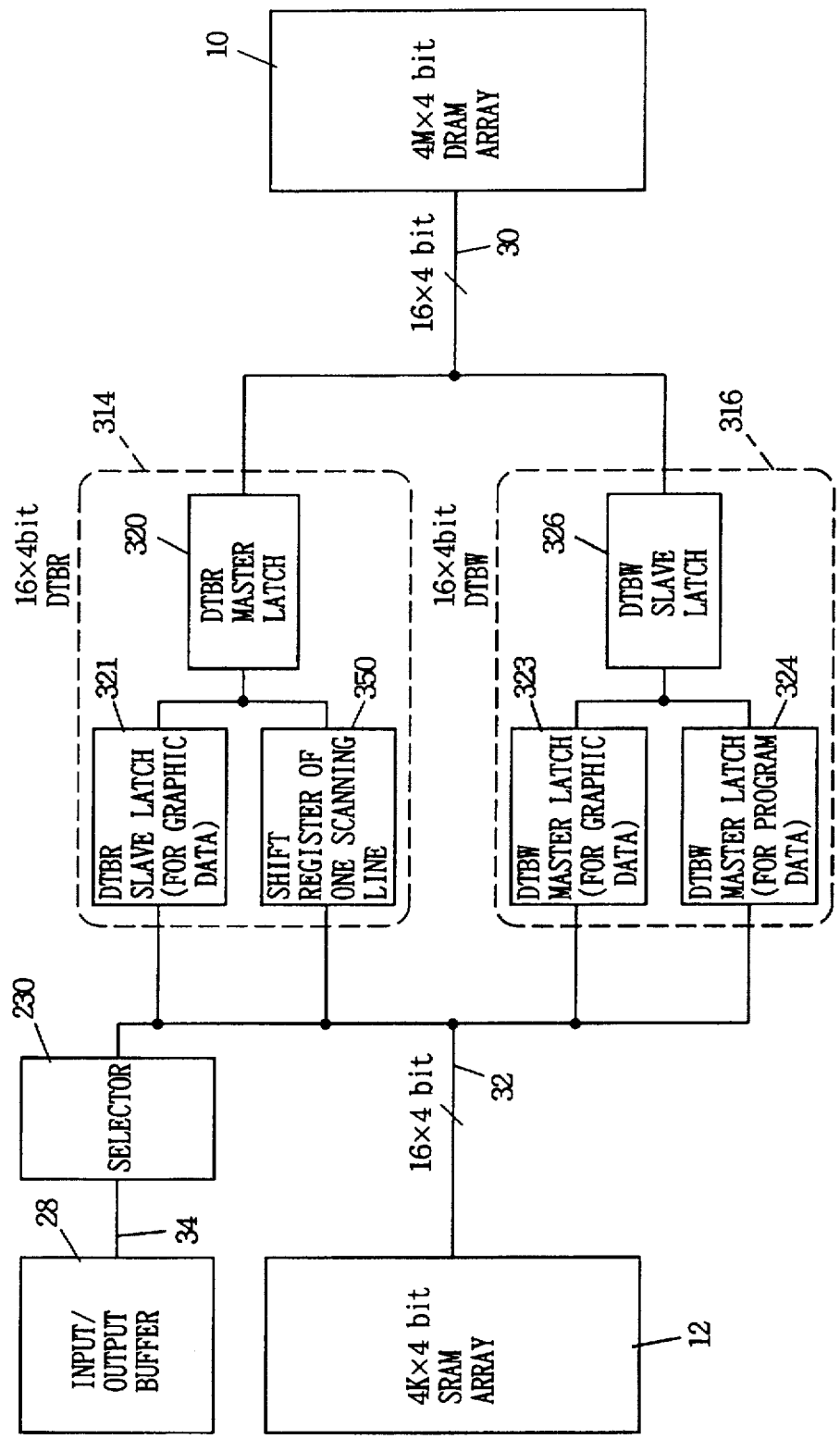
FIG. 14 schematically shows a structure of a main part of a semiconductor memory device according to a fifth embodiment of the present invention.

FIG. 14 is a block diagram schematically showing a structure of a main part of a semiconductor memory device according to a fifth embodiment of the present invention.

According to the structure shown in FIG. 14, DTBR 314 receiving and storing graphic data from DRAM array 10 has a shift register 350 provided instead of a slave latch for storing graphic data. Shift register 350 has a storage capacity for storing graphic data worthy in amount of one scanning line on the display screen of an image display unit. The structure of the components other than shift register 350 is identical to that shown in FIG. 11. Corresponding components have the same reference character allotted and their description will not be repeated.

The storage capacity of shift register 350 depends upon the number of pixels on one scanning line, the number of bits of one pixel data, and the organization of the pixel data (such as representation of one pixel data with a plurality of chips). For example, shift register 350 has a storage capacity of 1024·8=8K bits when one scanning line includes 1024 pixels, one pixel data is formed of 8 bits, and only one semiconductor memory device is used.

Figure 15:
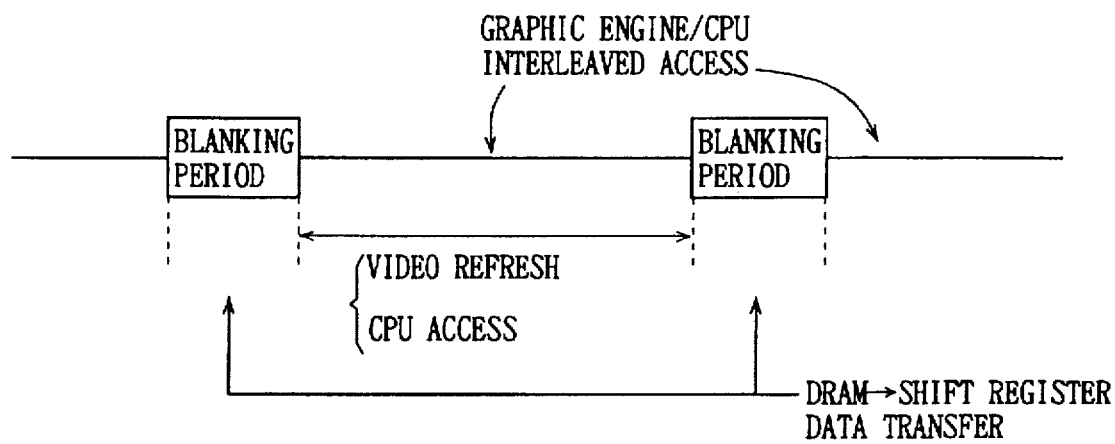
FIG. 15 is a diagram used for describing an operation of the semiconductor memory device of FIG. 14.

As shown in FIG. 15, pixel data for one scanning line is transferred from DRAM array 10 to shift register 350 during a horizontal blanking period or a vertical blanking period in displaying graphic data on an image display unit. Video refresh and CPU access are carried out between blanking periods. By video refresh, data stored in shift register 350 is sequentially read out and displayed on the display screen of the image display unit. In the video refresh/CPU access mode, external graphic engine and CPU access this semiconductor memory device in an interleaved manner. Since the pixel data for one scanning line is stored in shift register 350, the graphic engine can continuously read out the pixel data and display the graphic data on a display screen of the image display unit during a drawing mode (display of graphic data on a display screen of the image display unit). It is not necessary to transfer data from a DRAM array into a cache (GBUFR or DTBR) for each readout of each block data as in the case where graphic data is cached in block unit from the DRAM array during the drawing mode. Therefore, the wait cycle of the graphic engine can be eliminated to allow graphic data to be displayed at high speed.

Figure 16:
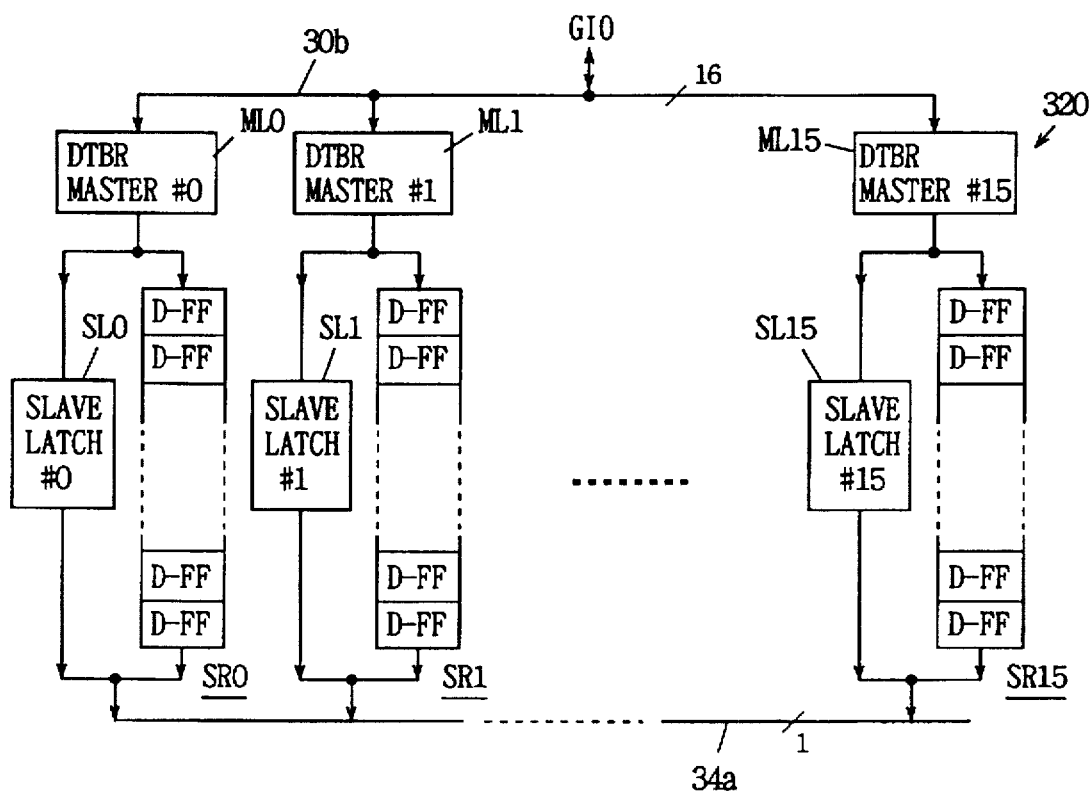
FIG. 16 schematically shows a structure of a shift register and a slave latch for an image shown in FIG. 14.

FIG. 16 shows a structure of the portion related to the portion outputting 1-bit data in DTBR 314 shown in FIG. 14. Referring to FIG. 16, DTBR master latch 320 includes sixteen DTBR master latches #0–#15 (ML0–ML15) coupled in parallel to a 16-bit DRAM data bus 30b (to respective bus lines). DTBR master latches ML0–ML15 each receive a corresponding bit on 16-bit DRAM data bus 30b in parallel. Slave latches SL0–SL15 storing program data are arranged corresponding to master latches ML0–ML15, respectively. In addition to slave latches SL0–SL15, shift register circuits SR0–SR15 are arranged. Slave latches SL0–SL15 and shift register circuits SR0–SR15 are coupled selectively to 1-bit input/output data bus line 34a.

Each of shift register circuits SR0–SR15 is formed of a plurality of stages of D flip-flops (D-FF). The number of D flip-flops (D-FF) in each of shift register circuits SR0–SR15 depends upon the structure of the pixel data. In transferring data from DRAM array 10 to shift register circuits SR0–SR15, block data of 16 bits are transferred onto DRAM data bus 30b, and respective bits are stored in DTBR master latches ML0–ML15. Then, the stored data in master latches ML0–ML15 are stored in the first stage D flip-flop (D-FF) of shift register circuits SR0–SR15. The next 16-bit block data is transferred onto a DRAM data bus 30b and stored in master latches ML0–ML15, respectively. Then, corresponding pixel data bits are transferred from respective master latches ML0–ML15 to respective shift register circuits SR0–SR15. By repeating the data transfer operation for a required number of times, graphic data corresponding to pixels of one scanning line are stored in shift register circuits SR0–SR15.

A column must be addressed in DRAM array 10 (for designating a data block) in transferring data from DRAM array 10 to shift register circuits SR0–SR15. Under the control of an external processor (graphic engine), a DRAM column address and a data transfer instruction are provided to effect a data transfer operation (during a blanking period).

Figure 17:
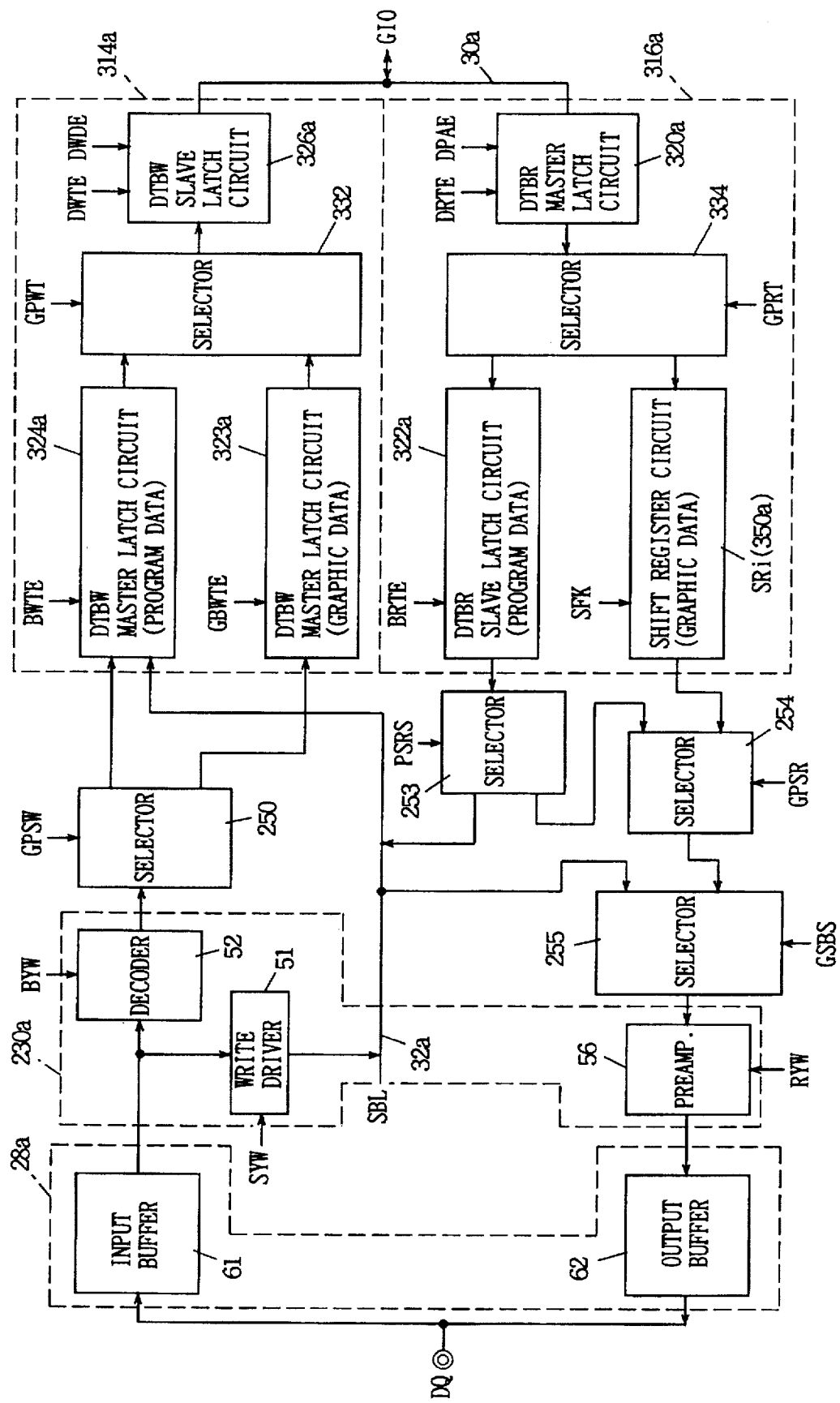
FIG. 17 shows a structure of the portion related to data input/output and transfer of 1-bit of the semiconductor memory device of FIG. 14.

FIG. 17 shows a structure of the portion related to input/output and transfer of 1-bit data in the semiconductor memory device of FIG. 14. In contrast to the structure shown in FIG. 12, the structure of FIG. 17 has a shift register circuit SRi (350a) provided in place of DTBR slave latch circuit 321a. The remaining structure of FIG. 17 is similar to that of FIG. 12, and corresponding components have the same reference characters allotted. Therefore, their description will not be repeated.

Shift register circuit SRi latches and transfers data in accordance with a shift clock SFK. The generation of shift clock SFK will be described afterwards. Graphic data is transferred from a master latch 320a to shift register circuit SRi (350a) via a selector 334 during a horizontal or vertical blanking period. By rendering shift clock SFK active for each transfer, data can be stored and transferred. In reading out data stored in shift register circuit SRi (350a), the graphic data stored therein is read out by a selector 254 to be transmitted to an output buffer 62 via a selector 255 and a preamplifier 56.

In transferring graphic data from DRAM array 10 to shift register 350 where graphic data of one row in DRAM array 10 corresponds to pixel data of one scanning line, a row in DRAM array 10 is selected and a column address is applied. As a result, data of one block (16·4 bits) are selected. This block select operation is repeated while data is transferred from DRAM array 10 to shift register 350. Since a data transfer operation can be effected by an instruction from an external device, the structure of the control unit for controlling the data transfer can be implemented by the structure shown in FIG. 10.

Figure 18:
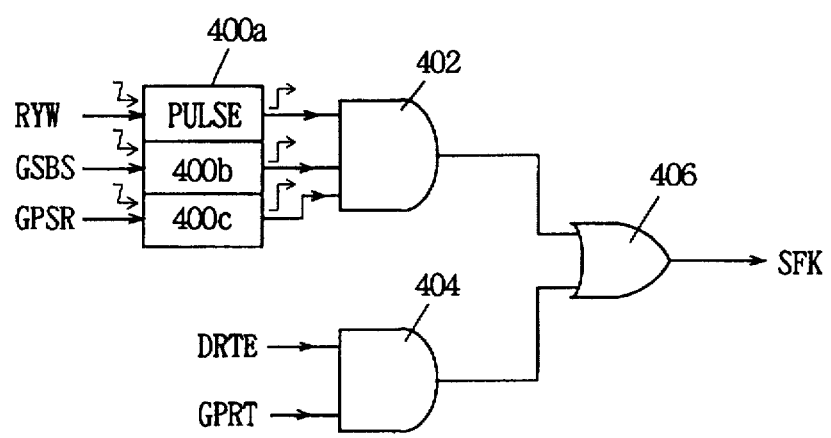
FIG. 18 shows a structure of the portion for generating a shift clock shown in FIG. 17.

FIG. 18 shows a structure of the portion for generating shift clock SFK of FIG. 17. Referring to FIG. 18, a shift clock generation unit includes a pulse generation circuit 400a responsive to a fall of select signal RYW from a column decoder for generating a one-shot pulse signal, a pulse generation circuit 400b responsive to transition of select control signal GSBS to a non-select state for generating a one-shot pulse signal, a pulse generation circuit 400c responsive to a transition of select control signal GPSR to an inactive state for generating a one-shot pulse signal, and an AND circuit 402 for receiving output signals of pulse generation circuits 400a–400c, an AND gate circuit 404 for receiving transfer control signals DTRE and GPRT, and an OR circuit 406 for receiving output signals from AND circuits 402 and 404.

Select signal RYW from the column decoder attains a high level when a corresponding data transfer buffer is selected. When select control signal GSBS attains a high level, selector 255 is set to select an output signal of selector 254 shown in FIG. 17. When select control signal GPSR attains a high level, a state of selecting an output signal of shift register circuit SRi (350a) is indicated. Therefore, according to an output signal from AND circuit 402, a shift operation is carried out after pixel data of shift register circuit SRi (350a) is read out. Here, it is assumed that shift register circuit SRi (350a) has the D flip-flop (D-FF) provided at the output stage thereof constantly apply data stored therein to selector 254.

During the activation of transfer control signal DRTE, data is transferred from master latch circuit 320a of FIG. 17 to slave latch 322a or shift register circuit SRi (350a). When select control signal GPRT attains a high level, selector 334 transfers the data received from master latch circuit 320a to shift register circuit SRi. An output signal of AND circuit 404 is pulled up to a high level when data is transferred from DRAM array 10 to shift register circuit SRi (350a). Therefore, shift clock SFK is pulled up to a high level via OR circuit 406, whereby shift register circuit SRi (350a) stores data transferred from DRAM array 10. Since shift clock SFK is rendered active for each transfer of data, stored data is sequentially transferred in shift register circuit SRi (350a).

In reading out data, an output signal of AND circuit 402 attains a high level after data read out is completed, and shift clock SFK from OR circuit 406 is pulled up to a high level. Therefore, a shift operation is carried in shift register circuit SRi (350a) for each readout of graphic data to prepare for the next data read out.

As described above, in the fifth embodiment of the present invention, a shift register that stores graphic data of one scanning line is provided in parallel to the slave latch portion of the DTBR. Therefore, graphic data of one scanning line can be transferred from a DRAM array to a shift register during a horizontal and a vertical blanking period. Graphic data can be continuously provided in displaying graphic data on a display screen of an image display unit, so that the waiting cycle during graphic data display can be eliminated. Thus, the load of an external processor (graphic engine) during a displaying operation can be alleviated. (High speed data processing to compensate for a waiting cycle, if any, will not be required by eliminating this waiting cycle. This is because the display period of one scanning line of an image display unit is determined in advance).

Sixth Embodiment

Figure 19:
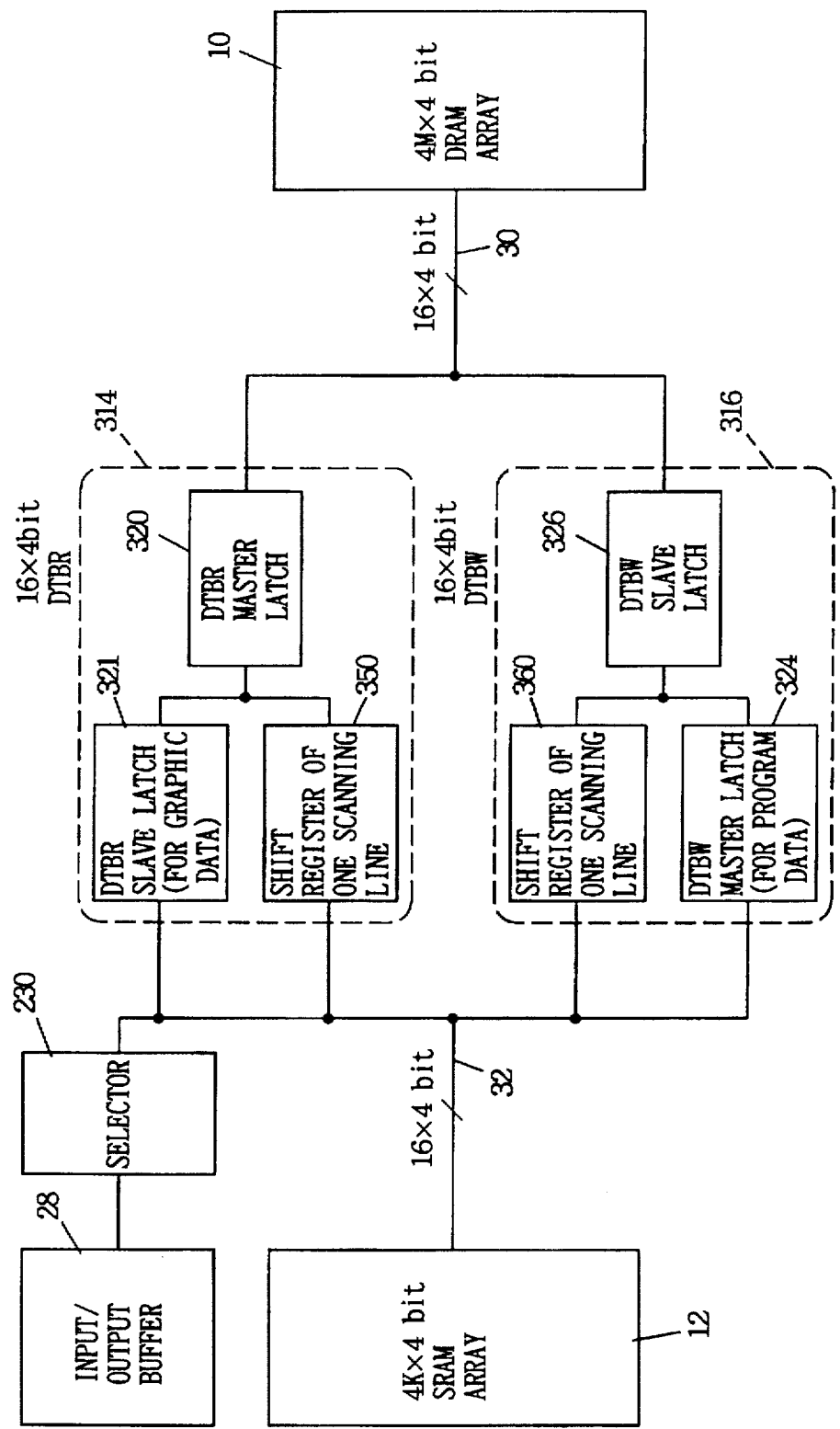
FIG. 19 schematically shows a structure of a main part of a semiconductor memory device according to a sixth embodiment of the present invention.

FIG. 19 schematically shows a structure of a main part of a semiconductor memory device according to a sixth embodiment of the present invention. In a transfer buffer (DTBW) 316 for transferring data to DRAM array 10, a shift register 360 for storing pixel data of one scanning line is provided instead of a master latch storing graphic data. The remaining structure is identical to that shown in FIG. 14, and corresponding components have the same reference characters allotted, and their detailed description will not be repeated.

When graphic data is sequentially applied from an external television camera in a raster scanning system in the structure of FIG. 19, the graphic data are sequentially stored into shift register 360, and then transferred to a corresponding graphic data region in DRAM array 10 via slave latch 326 during the next horizontal scanning blanking period or vertical scanning blanking period. The provision of this shift register 360 eliminates the need to inhibit writing of external graphic data while graphic data from a television camera is sequentially transmitted and then transferred to DRAM array 10. Therefore, it is not necessary to provide an external buffer memory for the wait of this data writing, resulting in reduction of the system scale.

Figure 20:
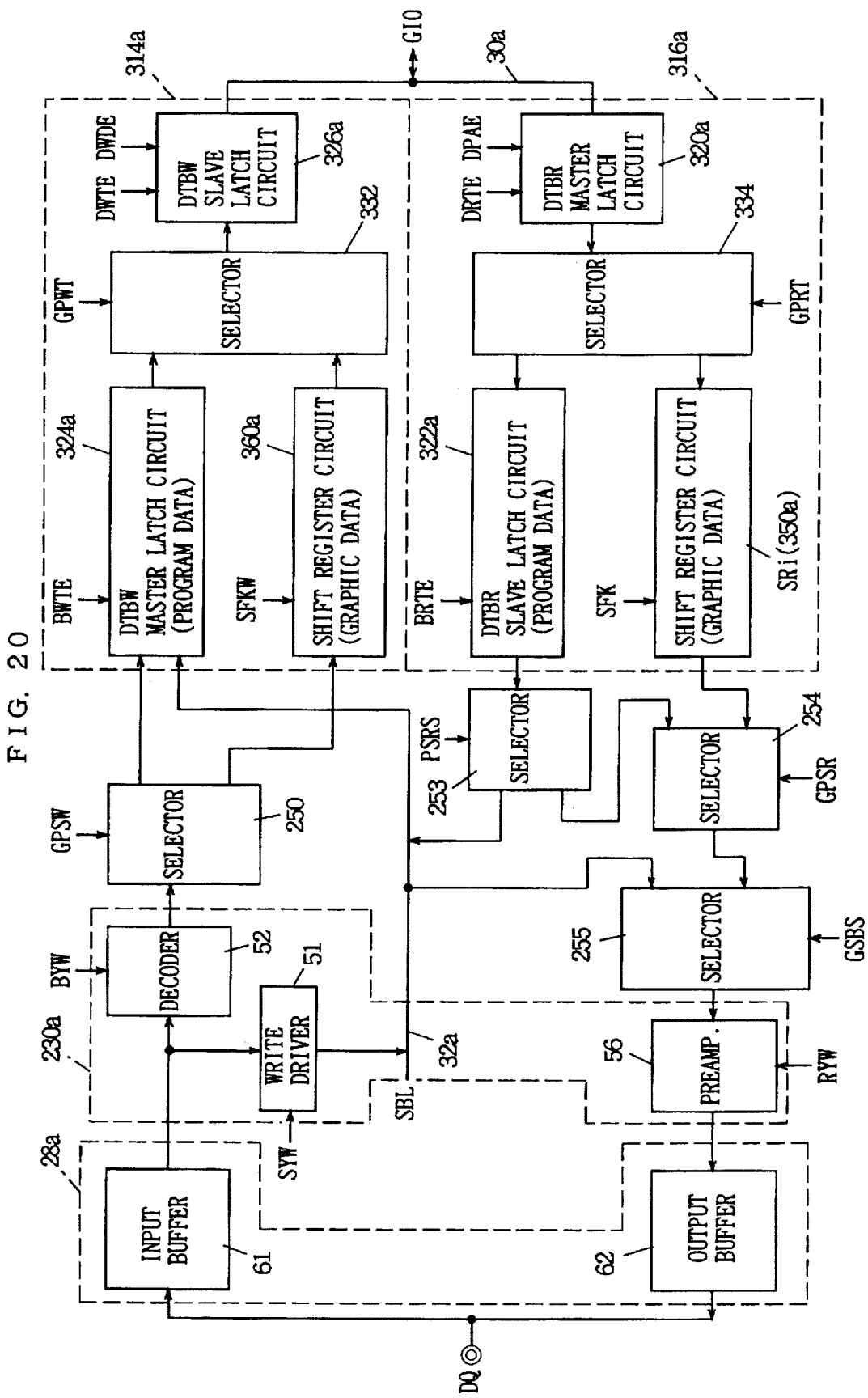
FIG. 20 schematically shows a structure of the portion related to input/output and transfer of data of 1-bit of the semiconductor memory device of FIG. 19.

FIG. 20 shows a structure of the portion related to input/output and transfer of 1-bit data in the semiconductor memory device of FIG. 19. The structure of FIG. 20 is similar to that shown in FIG. 17, except that a shift register circuit 360a is used instead of a master latch circuit in data transfer buffer DTBW 314a. Corresponding components have the same reference characters allotted, and their description will not be repeated.

Shift register circuit 360a stores and shifts data in accordance with a shift clock SFKW. Similar to shift register circuit 350a, shift register circuit 360a is formed of a plurality of stages of D flip-flops (D-FF). The circuitry of generating control signals for the configuration of FIG. 20 can be implemented with the configuration shown in FIG. 13. The circuitry for generating shift clock SFK can be implemented with the arrangement shown in FIG. 18.

Figure 21:
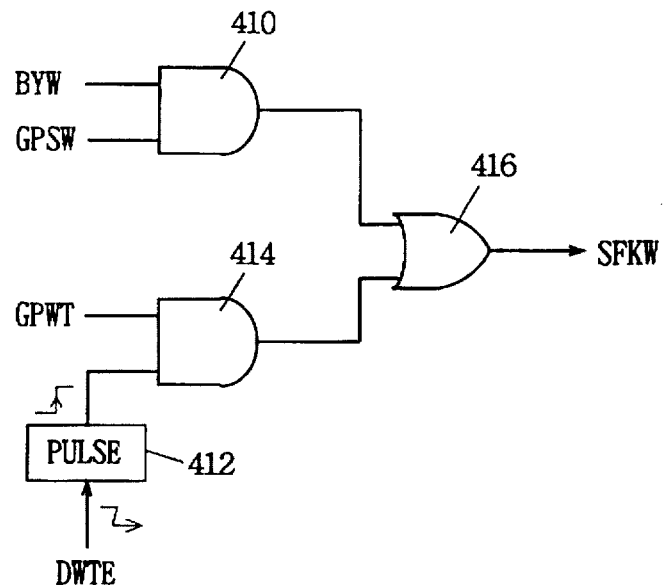
FIG. 21 shows a structure of the portion generating a system clock provided to a shift register circuit for storing write graphic data shown in FIG. 20.
Figure 22:
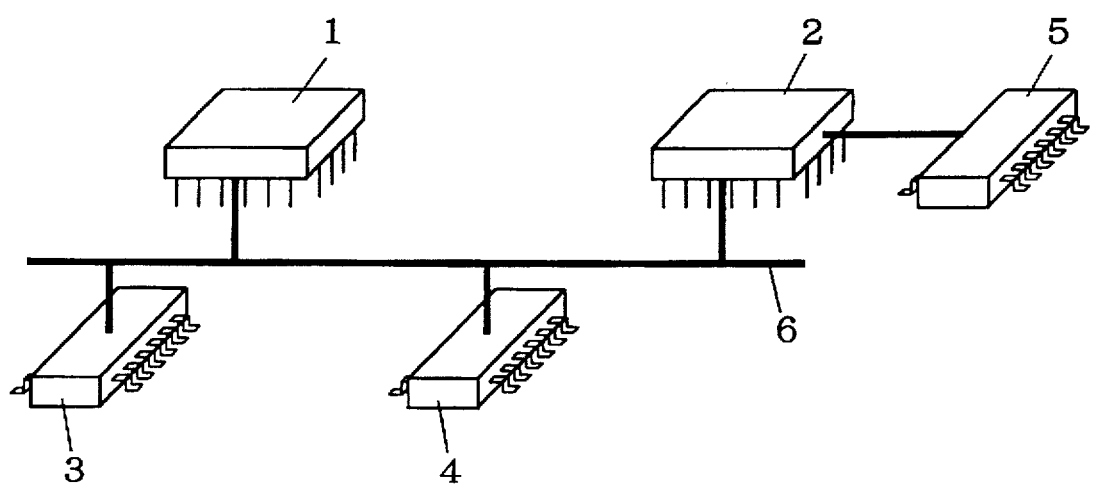
FIG. 22 schematically shows a structure of a conventional data processing system.
Figure 23:
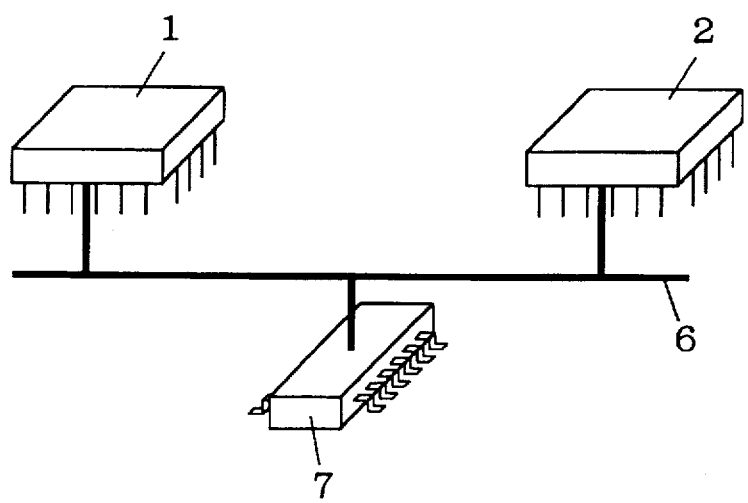
FIG. 23 schematically shows a structure of another conventional data processing system.
Figure 24:
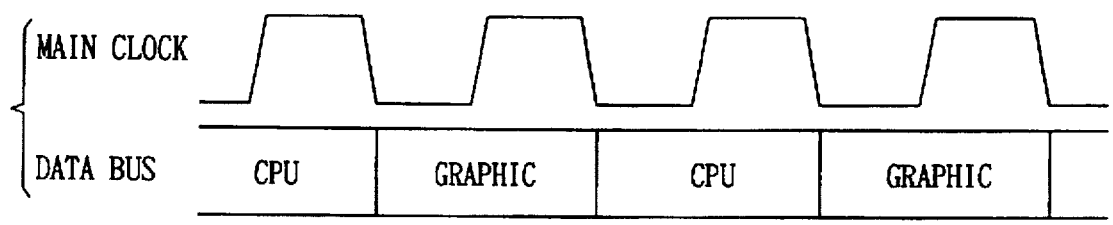
FIG. 24 shows an access sequence for a semiconductor memory device of the data processing system shown in FIG. 23.
Figure 25:
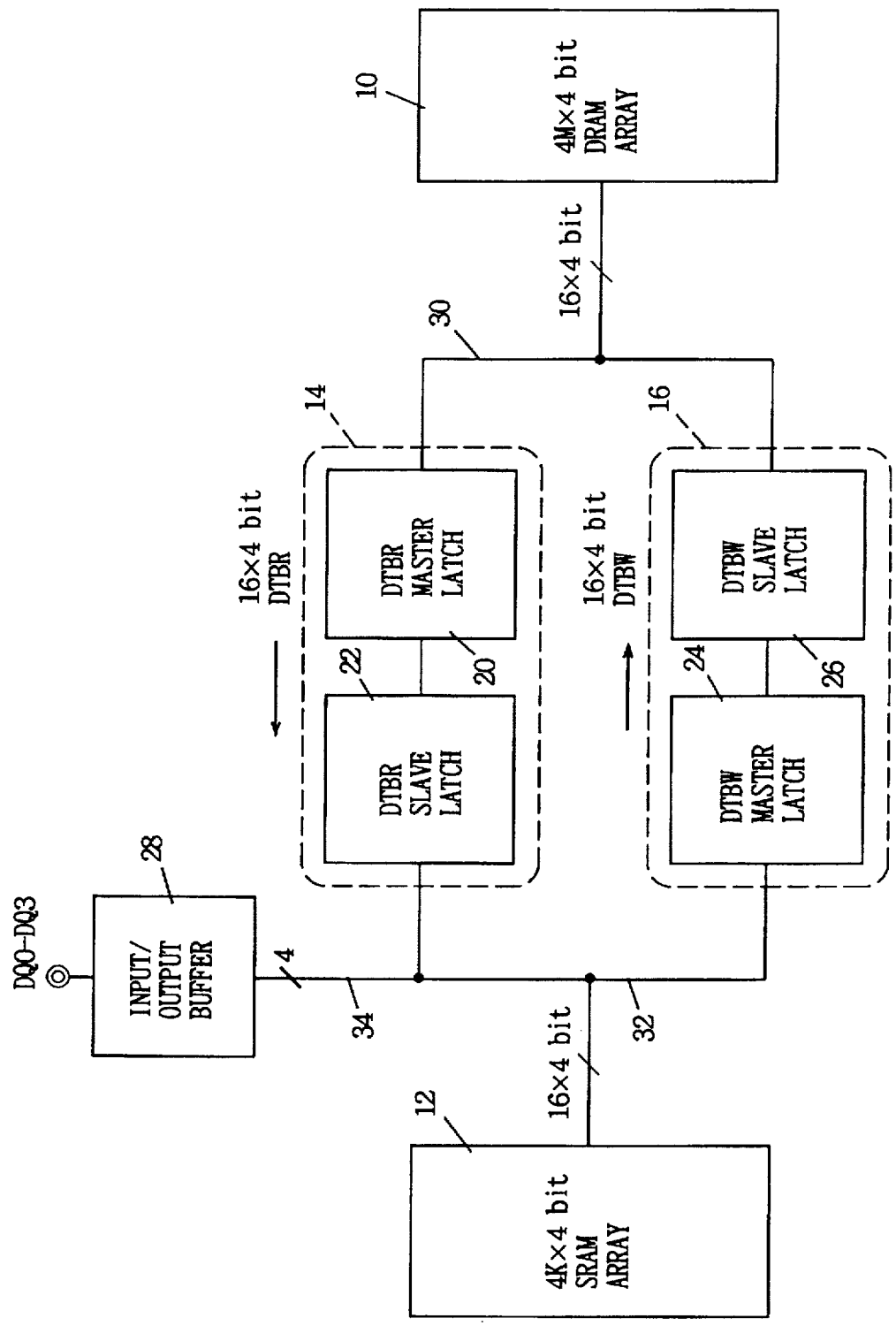
FIG. 25 schematically shows a structure of a main part of a conventional semiconductor memory device.

FIG. 21 shows the configuration of the portion for generating shift clock SFKW. Referring to FIG. 21, shift clock generation unit includes an AND circuit 410 receiving select signal BYW and select control signal GBSW, a pulse generation circuit 412 responsive to a fall of transfer control signal DBWT for generating a one-shot pulse signal, an AND circuit 414 for receiving an output signal of pulse generation circuit 412 and select control signal GBWT, and an OR circuit 416 for receiving output signals of AND circuits 410 and 414. Shift clock SFKW is generated from OR circuit 416.

When select control signal GBSW attains a high level, selector 250 transmits write data from decoder 52 to shift register circuit 360a. In a shift register circuit for writing externally applied graphic data, an output signal of AND circuit 410 attains a high level, and responsively shift clock SFKW from OR circuit 416 is pulled up to a high level.

The write graphic data supplied from selector 250 is stored in shift register circuit 360a. When control signal GPWT attains a high level in data transfer, selector 332 selects an output signal of shift register circuit 360a. At the first cycle, data stored in the last stage in shift register circuit 360a is transmitted to slave latch circuit 326a via selector 332. At the completion of this data transfer operation, transfer control signal DWTE is pulled down to a low level, whereby an output signal of pulse generation circuit 412 attains a high level for a predetermined time. Therefore, after this data transfer into slave latch circuit 326a, an output signal of AND circuit 414 attains a high level, and responsively shift clock SFKW from OR circuit 416 goes high. As a result, subsequent to the data transfer into DRAM array 10, shift register circuit 360a has the latched graphic data shifted by one flip-flop stage. In a data transfer operation, transfer control signal DWTE is rendered active repeatedly by a predetermined number of times. Therefore, shift clock SFKW can be set an active state in data transfer by a required number of times.

As in shift register circuit 350, the number of stages of shift registers included in shift circuit 360 is selected appropriately according to the structure of the write graphic data.

As described above, according to the sixth embodiment of the present invention, a shift register storing write data of one scanning line is arranged in a transfer buffer that transfers data to a DRAM array. Even when external graphic data is continuously applied according to a raster scan sequence, the external device can write graphic data at high speed into this semiconductor memory device with no waiting cycle by carrying out data transfer from this shift register to the DRAM array during a horizontal and a vertical blanking period.

Other Applications

The present invention is not limited to the above embodiments in which a graphic engine processes graphic data and carries out a display process and in which CPU processes only the program data. Such a structure may be employed that an external processor carries out only data transfer to an image display unit, and CPU processes program data and graphic data. In this case, the program data is defined as the data processed by the CPU.

In the above-described embodiments, a DRAM array and an SRAM array are provided in a semiconductor memory device. The semiconductor memory device of the present invention may have a high speed operating DRAM and a relatively low speed operating non-volatile memory such as a flash memory integrated on the same chip. Similarly, a structure may be employed in which an SRAM and a flash memory are integrated on the same chip.

Furthermore, the data processed by the present data processing system is not limited to graphic data, and may be another type of data used in a particular process such as audio data.

Thus, a semiconductor memory device of the present invention including a memory that can be accessed at high speed and a memory of a large storage capacity has a buffer provided for storing data used for a particular process, so that a cache that has an optimum size with respect to data used in a particular process can be implemented. Even in the case of a CPU cache miss, data can be transferred between two memory arrays with no destruction of the data used in the particular process. The frequency of the wait cycles of high performance for the CPU can be reduced to realize a semiconductor memory device of high performance directed to multimedia system.

In addition, the semiconductor memory device including DRAM array and SRAM array and a processor such as CPU and the graphic engine may be integrated on a same common chip, and a one-chip processing system may be implemented. In this arrangement, data to be processed and program instructions may be selectively stored in the registers, and a high speed, down-sized data processing system can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a first memory array including a plurality of memory cells, a second memory array including a plurality of memory cells, data transfer means provided between said first and second memory arrays, for transferring data therebetween, storage means for storing and transferring data used for a particular process with the first memory array, and an input/output circuit selectively coupled to one of said data transfer means, said second memory array and said storage means, for transferring data between an outside of the semiconductor memory device and a selectively coupled one of said data transfer means, said second memory array and said storage means.

2. The semiconductor memory device according to claim 1, wherein said storage means comprises readout data storage means for storing data received from said first memory array via said data transfer means and for supplying the stored data to the outside via said input/output circuit.

3. The semiconductor memory device according to claim 1, wherein said storage means comprises write data storage means for storing data supplied from the outside via said input/output circuit and for applying the stored data to said first memory array via said data transfer means.

4. The semiconductor memory device according to claim 1, wherein said storage means comprises storage/transfer means provided in parallel to said data transfer means for storing data supplied from said input/output circuit and transferring the stored data into said first memory array.

5. The semiconductor memory device according to claim 1, wherein said storage means comprises storage/transfer means coupled to said first memory array in parallel to said data transfer means for receiving and storing data from said first memory array and supplying the stored data via said input/output circuit to the outside.

6. The semiconductor memory device according to claim 1, wherein said data transfer means comprises, master latch means for receiving and storing data transferred from said first memory array, and slave latch means for receiving latched data from said master latch means, said slave latch means including means for transferring received and stored data into said second memory array and selectively transferring the same to said input/output circuit, and wherein said storage means comprises means provided in parallel to said slave latch means and between said master latch means and said input/output circuit, for receiving and storing data from said master latch means and selectively transmitting the stored data to said input/output circuit.

7. The semiconductor memory device according to claim 1, wherein said data transfer means comprises master latch means for receiving and storing data selectively supplied from said second memory array and said input/output circuit, and slave latch means for receiving stored data from said master latch means and transferring the same to said first memory array, and wherein said storage means comprises means provided in parallel to said master latch means for storing data from said input/output circuit and transferring the stored data to said first memory array via said slave latch means.

8. The semiconductor memory device according to claim 1, wherein said data transfer means comprises means for transferring simultaneously data of a plurality of bits between said first and second memory arrays, wherein said storage means has a capacity for storing data of said plurality of bits.

9. The semiconductor memory device according to claim 1, wherein said particular process is a graphic data process, and said storage means has a storage capacity sufficient for storing pixel data of one scanning line on a display screen of an image display device.

10. The semiconductor memory device according to claim 1, wherein said storage means comprises readout data storage means for storing data received from said first memory array via said data transfer means and for supplying the stored data to the outside via said input/output circuit, and write data storage means for storing data supplied from the outside via said input/output circuit and for transferring the stored data to said first memory array via said data transfer means.

11. The semiconductor memory device according to claim 1, wherein said storage means comprises write storage/transfer means provided in parallel to said data transfer means for storing data supplied from said input/output circuit and transferring the stored data into said first memory array, and read storage/transfer means coupled to said first memory array in parallel to said data transfer means for receiving and storing data from said first memory array and supplying the stored data via said input/output circuit to the outside.

12. The semiconductor memory device according to claim 1, wherein said data transfer means comprises, read master latch means for receiving and storing data transferred from said first memory array, and read slave latch means for receiving latched data from said read master latch means, said read slave latch means including means for transferring received and stored data into said second memory array and selectively transferring the same to said input/output circuit, write master latch means for receiving and storing data selectively supplied from said second memory array and said input/output circuit, and write slave latch means for receiving stored data from said write master latch means and transferring the same to said first memory array, and wherein said storage means comprises read storage means provided in parallel to said read slave latch means and between said read master latch means and said input/output circuit, for receiving and storing data from said read master latch means and selectively transmitting the stored data to said input/output circuit, and write storage means provided in parallel to said write master latch means for storing data from said input/output circuit and transferring the stored data to said first memory array via said write slave latch means.

13. The semiconductor memory device according to claim 4, wherein said data transfer means includes read data transfer means for transferring data received from said first memory array to said second memory array, and write data transfer means for transferring data to said first memory array, and wherein said storage/transfer means is identical in configuration with said write data transfer means.

14. The semiconductor memory device according to claim 5, wherein said data transfer means includes read data transfer means for transferring data received from said first memory array to said second memory array, and write data transfer means for transferring data to said first memory array, and wherein said storage/transfer means is identical in structure to said read data transfer means.

15. The semiconductor memory device according to claim 6, wherein said means included in said storage means is identical in configuration with said slave latch means.

16. The semiconductor memory device according to claim 7, wherein said means included in said storage means is identical in configuration with said slave latch means.

17. The semiconductor memory device according to claim 4, wherein said storage means comprises a shift register circuit including a plurality of cascaded registers for storing pixel data worthy in amount of one scanning line of a display screen of a display unit.

18. The semiconductor memory device according to claim 5, wherein said storage means comprises a shift register circuit including a plurality of cascaded registers for storing pixel data worthy in amount of one scanning line of a display screen of a display unit.

* * * * *